(12) United States Patent
Shirakawa

(10) Patent No.: US 6,633,075 B1
(45) Date of Patent: Oct. 14, 2003

(54) HETEROJUNCTION BIPOLAR TRANSISTOR AND METHOD FOR FABRICATING THE SAME

(75) Inventor: Kazuhiko Shirakawa, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/641,819

(22) Filed: Aug. 18, 2000

(30) Foreign Application Priority Data

Aug. 19, 1999 (JP) .......................................... 11-232671

(51) Int. Cl.[7] ..................... H01L 27/082; H01L 27/102; H01L 29/70; H01L 31/11
(52) U.S. Cl. ........................................ 257/565; 257/587
(58) Field of Search ........................... 257/587, 579, 257/197, 712, 198, 400, 401, 421, 796, 675, 566, 602, 600, 601; 361/386

(56) References Cited

U.S. PATENT DOCUMENTS

| 4,939,562 A | | 7/1990 | Adlerstein |
| 5,198,964 A | * | 3/1993 | Ito et al. .................... 361/386 |
| 5,734,193 A | * | 3/1998 | Bayraktaroglu et al. .... 257/579 |
| 5,864,169 A | * | 1/1999 | Shimura et al. ............ 257/587 |
| 2001/0055955 A1 | * | 12/2001 | Wagemans ............... 455/226.4 |

FOREIGN PATENT DOCUMENTS

| DE | 003825979 A1 | * | 2/1990 |
| EP | 0 693 778 A2 | | 5/1996 |
| EP | 0 907 206 A1 | | 4/1999 |
| JP | 406209058 A | * | 7/1994 |
| JP | 406216270 A | * | 8/1994 |
| JP | 8-279562 A | | 10/1996 |
| JP | A8279562 | | 10/1996 |

OTHER PUBLICATIONS

William H. Hayt, Jr., Engineering Electromagnetics 1989, McGraw–Hill, Inc., Fifth Edition, pp. 229–231.*

* cited by examiner

Primary Examiner—Wael Fahmy
Assistant Examiner—Dana Farahani
(74) Attorney, Agent, or Firm—Birch, Stewart, Kolasch & Birch, LLP

(57) ABSTRACT

A heterojunction bipolar transistor includes an emitter layer, a base layer and a collector layer laminated on a top surface of a semiconductor substrate, and a heat sink layer made of a metal and provided on a rear surface of the substrate. A via hole is cut through the emitter layer, the base layer, the collector layer and the substrate. A surface electrode of the emitter layer and the heat sink layer are connected to each other by a metal wiring line running through within the via hole, which is capable of improving the heat radiation and reducing the emitter inductance.

10 Claims, 22 Drawing Sheets

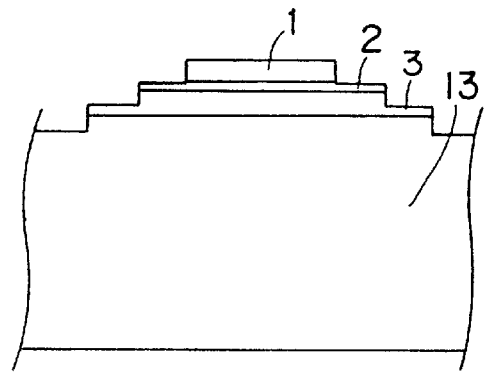
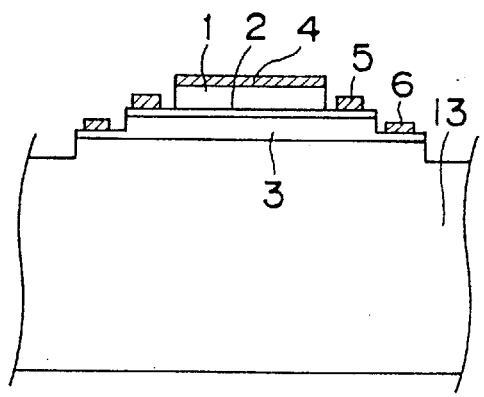
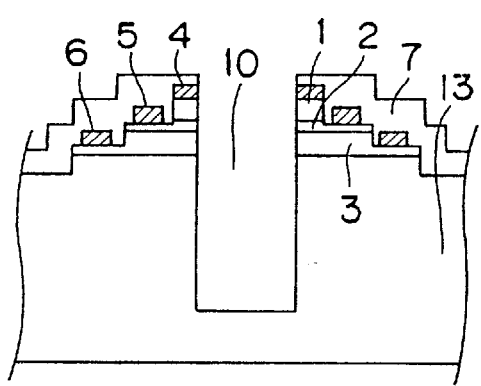
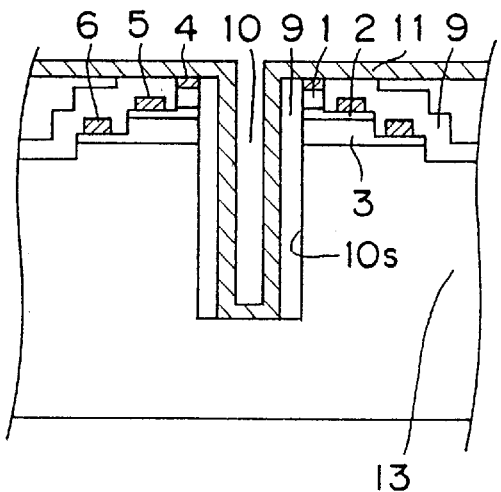
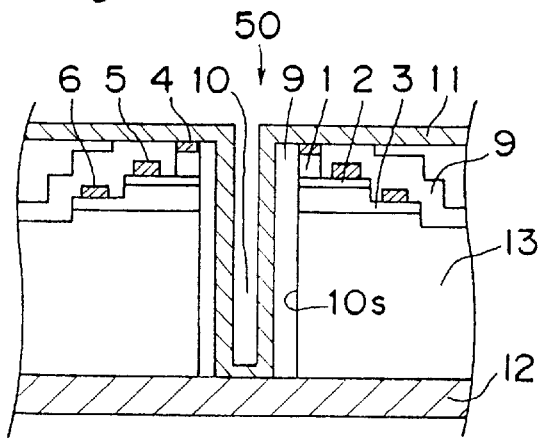

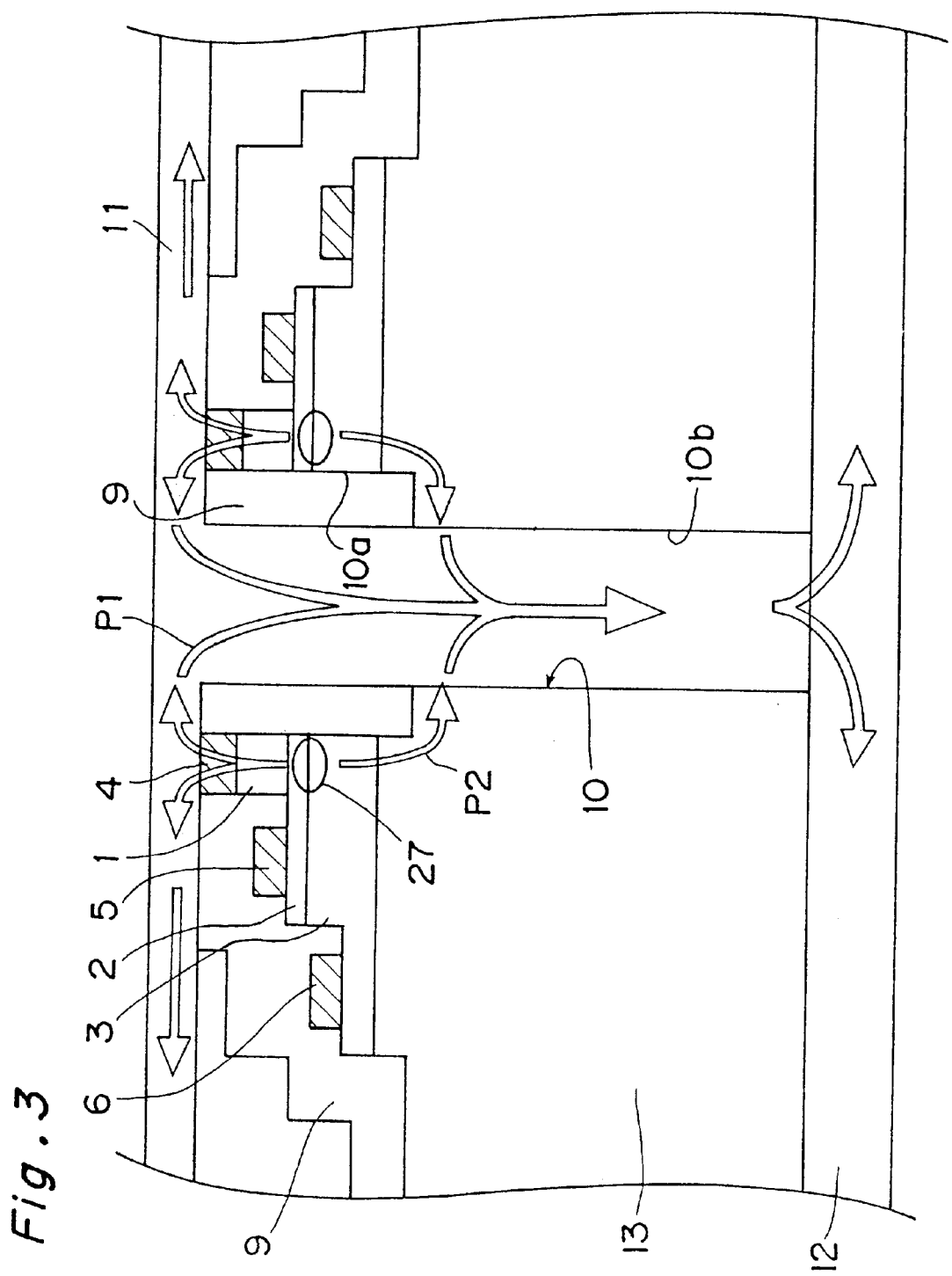

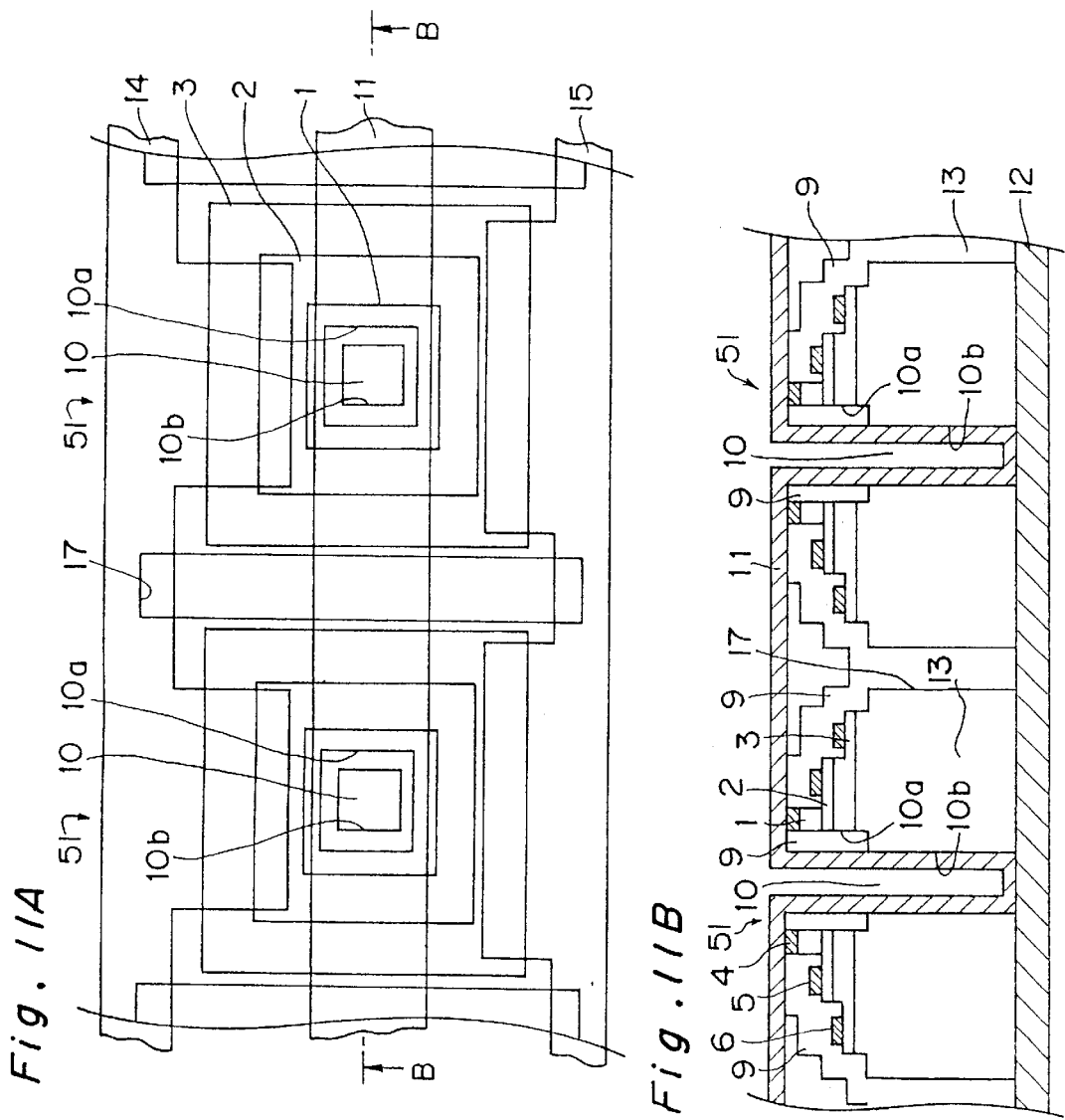

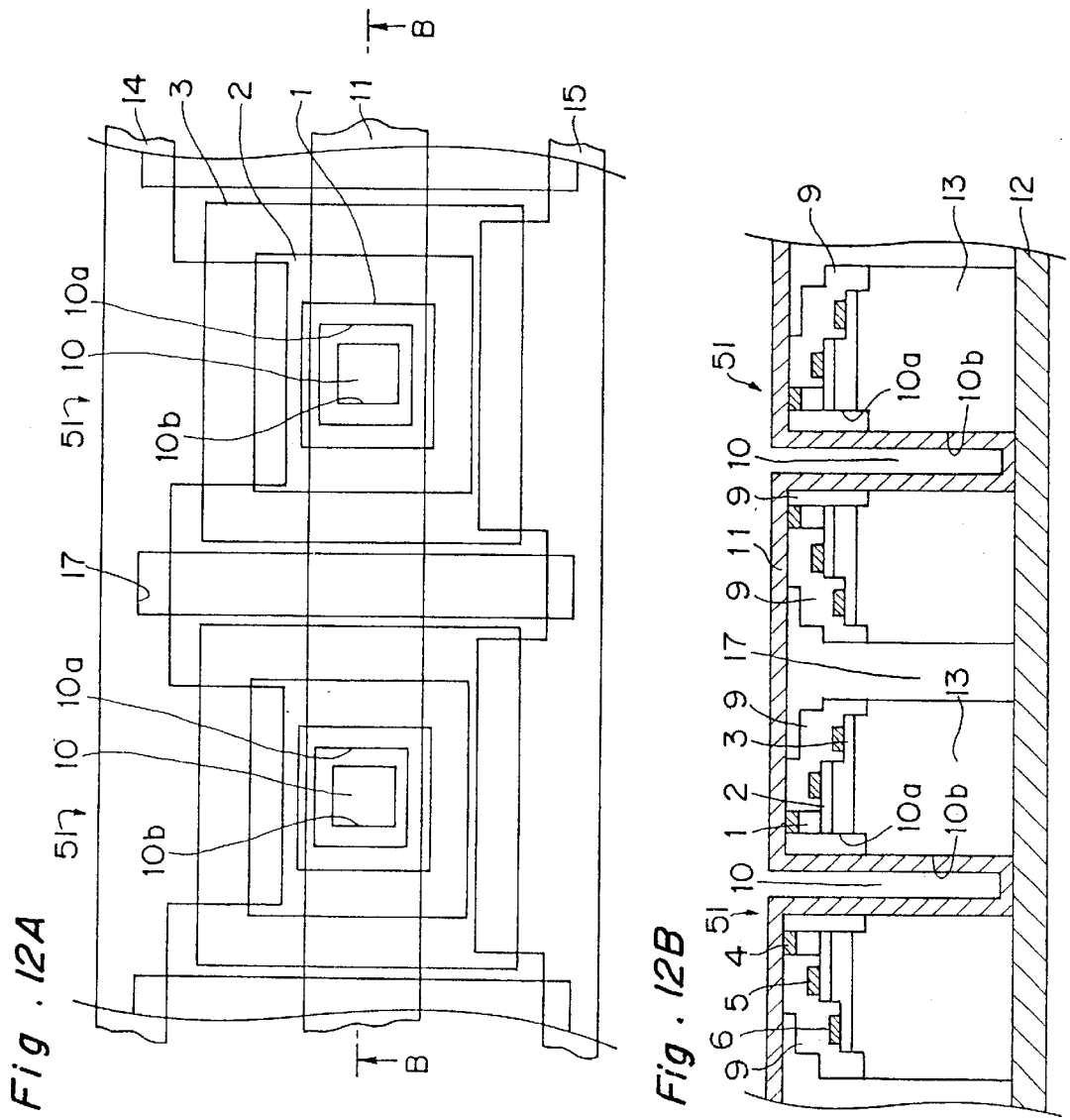

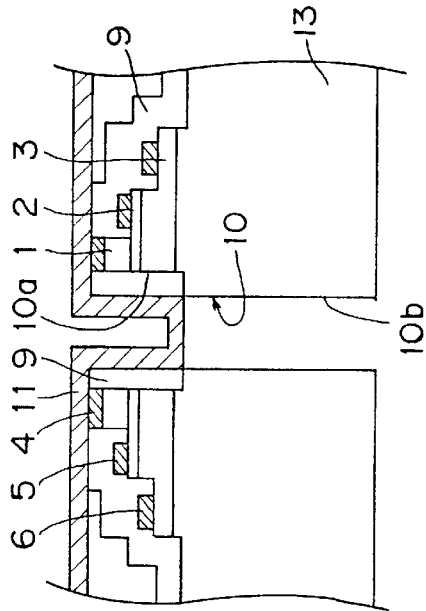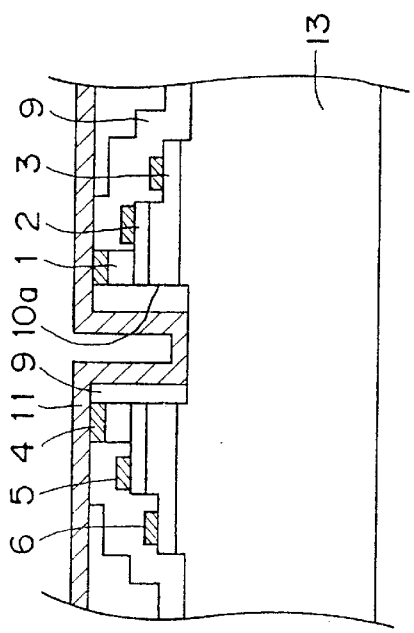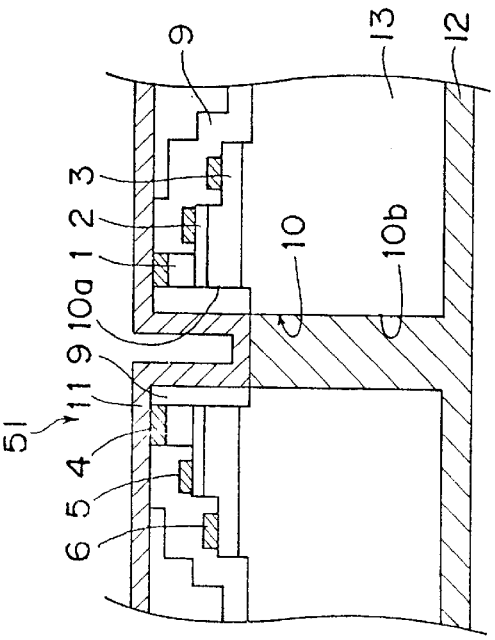

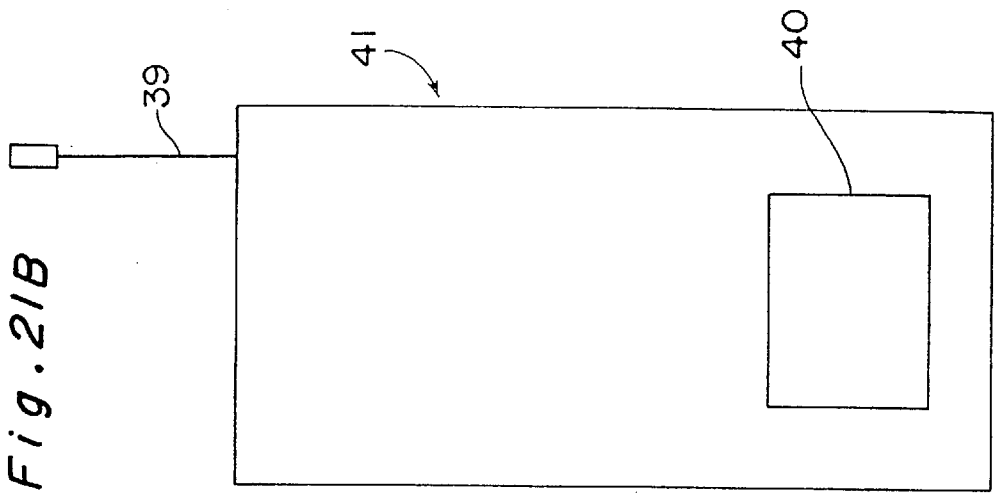
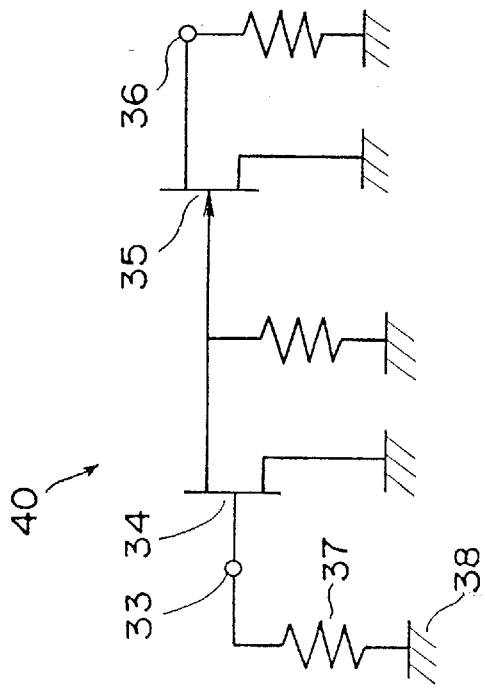

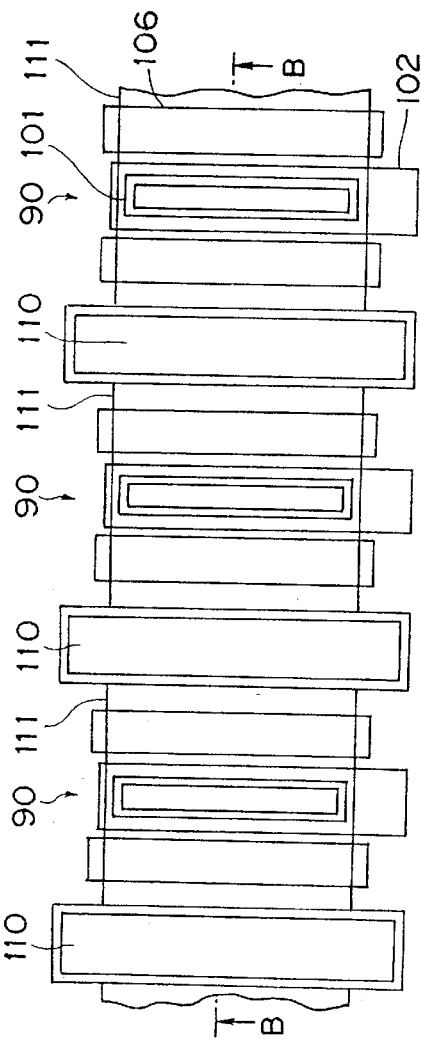
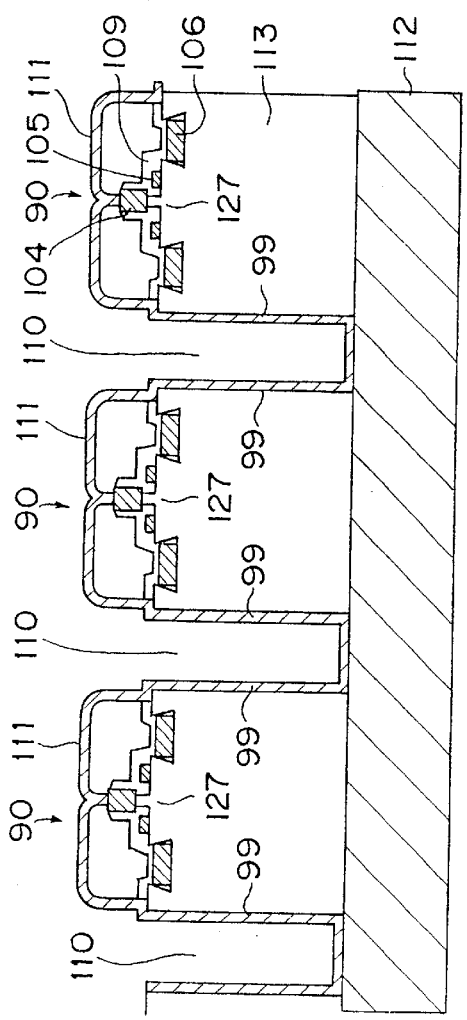
Fig. 22A PRIOR ART
Fig. 22B PRIOR ART

HETEROJUNCTION BIPOLAR TRANSISTOR AND METHOD FOR FABRICATING THE SAME

BACKGROUND OF THE INVENTION

The present invention relates to heterojunction bipolar transistors including those connected in parallel and methods for fabricating the same. The invention also relates to a high-frequency transmitter or receiver having a heterojunction bipolar transistor as an amplifier.

As a high-power device for microwave band, there has been developed GaAs-based heterojunction bipolar transistors (hereinafter, referred to as HBTs). Generally, HBTs, which are high in thermal resistance, have a problem that when used as a high-power device, HBTs would involve high junction temperature. On this account, as shown in FIG. 22, a structure for improving heat radiation property has been proposed in Japanese Patent Laid-Open Publication HEI 8-279562. FIG. 22A shows a planar pattern of HBTs connected in parallel for high-power operation, and FIG. 22B shows a cross section taken along a line B—B of FIG. 22A. In this structure, a plurality of HBTs 90 each having a collector electrode 106, a base electrode 105 and an emitter electrode 104 are included on the surface side of a GaAs substrate 113, where via holes 110 are provided between adjacent HBTs 90 so as to be cut through the substrate from its top to rear surface side. Heat generated at a junction 127 on the top surface side of each HBT 90 is conducted from the emitter electrode 104 of the transistor to a metal body 99 within its adjacent via holes 110 via an air bridge 111, and further conducted from the metal body 99 to a plated heat sink (hereinafter, referred to as PHS) layer 112 provided on the substrate rear surface, thus being radiated.

However, this conventional structure has a first drawback that for implementation of even higher power output, electric resistance of the air bridge 111 is not negligible, with heat radiation effect insufficient, so that the junction temperature inside the transistor cannot be reduced sufficiently. In this conventional structure, there is a second drawback that because of limitations in reducing the emitter inductance, there may arise variations in high frequency characteristics or the gain in high frequency operation may decline.

SUMMARY OF THE INVENTION

Accordingly, an object of the present invention is to provide a heterojunction bipolar transistor (including those connected in parallel) which is capable of improving the heat radiation and reducing the emitter inductance.

Another object of the invention is to provide a fabricating method capable of fabricating such a heterojunction bipolar transistor.

A further object of the invention is to provide a high-frequency transmitter or receiver having such a heterojunction bipolar transistor as an amplifier.

In order to achieve the above-mentioned object, the present invention provides a heterojunction bipolar transistor comprising: an emitter layer, a base layer and a collector layer laminated on a top surface of a semiconductor substrate; and a heat sink layer made of a metal and provided on a rear surface of the substrate, wherein a via hole is cut through the emitter layer, the base layer, the collector layer and the substrate, and a surface electrode of the emitter layer and the heat sink layer are connected to each other by a metal wiring line running through within the via hole.

In the heterojunction bipolar transistor of this invention, heat generated during operation at junctions (mainly, an interface between the base layer and the collector layer) on the top surface side of the semiconductor substrate is dissipated through two paths. One of the paths is a path along which the heat conducts from the junction via the surface electrode of the emitter layer to the metal wiring line on the substrate top surface side, and further conducts from the metal wiring line within the via hole to the heat sink layer on the substrate rear surface side. The other path is a path along which heat conducts from the junction via an interior of the substrate to the metal wiring line within the via hole, and further conducts from there to the heat sink layer on the substrate rear surface side. Since the heat generated at the junction is dissipated through two paths as described above, heat radiation property of the heterojunction bipolar transistor is improved. Also, since the via hole extends through the emitter layer, the base layer, the collector layer and the substrate, the surface electrode of the emitter and the top surface of the via hole are very close to each other. Therefore, the metal wiring line is led from the surface electrode of the emitter layer into the via hole at a very short distance. As a result, emitter inductance is reduced and high-frequency characteristics are improved, as compared with the case where an air bridge is used.

In an embodiment of the invention, the via hole has a cross section formed into a polygonal shape in which apex angles are obtuse angles, or a circular shape.

When the cross-sectional shape of the via hole has acute angles, there is a possibility that electric field concentration may occur at the acute-angle portions during operation, causing the device reliability to lower. Thus, in the heterojunction bipolar transistor of this embodiment, the via hole has a cross section formed into a polygonal shape in which apex angles are obtuse angles, or a circular shape. As a result, electric field concentration around the via hole is suppressed. Therefore, the device reliability is improved.

In an embodiment of the invention, an interior of the via hole is buried with a same material as that of the metal wiring line.

In the heterojunction bipolar transistor of this embodiment, since the interior of the via hole is buried with the same material as that of the metal wiring line, the heat radiation effect through the via hole is enhanced, so that the heat radiation property is further improved. As a result, stabler device characteristics as well as higher device reliability can be obtained.

In an embodiment of the invention, a peripheral edge portion of the emitter layer is formed so as to be thinner in thickness than residual portion of the emitter layer.

In the heterojunction bipolar transistor of this embodiment, the thickness of the peripheral edge portion of the emitter layer is thinner than the thickness of the residual portion of the emitter layer, that is, what we called an edge-thinning structure is formed. Therefore, re-combination of holes and electrons generated between the peripheral edge portions of the emitter layer and the base layer during operation is prevented. As a result, the device reliability can be enhanced.

In an embodiment of the invention, a plurality of heterojunction bipolar transistors are arrayed on a common semiconductor substrate and electrically connected to one another so as to be enabled to operate in parallel.

In this parallel-connected heterojunction bipolar transistors, since any of the heterojunction bipolar transistors are electrically connected to one another so as to be enabled to operate in parallel, a high-power output operation is enabled. Also, heat generated at the junction of each transistor is dissipated to the heat sink layer on the substrate rear surface. Therefore, heat concentration due to performance variations among the transistors is suppressed so that the reliability is improved.

In an embodiment of the invention, a groove extending from the top surface of the substrate to the rear surface of the substrate is provided in the common semiconductor substrate so as to partition adjacent heterojunction bipolar transistors from one another.

Generally, in parallel-connected heterojunction bipolar transistors, adjacent transistors would thermally affect one another during operation. When one transistor is unequally heated with the result of nonuniform heat generation, a transistor adjacent to the transistor is affected with the result of heat generation, which in some extreme cases leads to breakage. Also, when no transistor is present in adjacency to one transistor, there is a possibility that the thermal balance collapses, leading to a similar result. Therefore, in the parallel-connected heterojunction bipolar transistors of this embodiment, a groove which extends from top surface to rear surface of the substrate is provided in the common semiconductor substrate so as to partition adjacent heterojunction bipolar transistors from each other. As a result, adjacent heterojunction bipolar transistors are thermally shielded from each other during operation, thus never affecting each other thermally. Moreover, the transistors are uniformized in heat capacity, thus operating uniformly. Therefore, the device reliability can be improved.

The present invention also provides a method for fabricating a heterojunction bipolar transistor, comprising the steps of: laminating a collector layer, a base layer and an emitter layer in this order on a top surface side of a semiconductor substrate; patterning the collector layer, the base layer and the emitter layer so that an area of an upper layer among the collector layer, the base layer and the emitter layer may become smaller; forming a surface electrode for ohmic contact on each surface portion of the collector layer, the base layer and the emitter layer; forming a first via hole which extends through the emitter layer, the base layer and the collector layer and ends at a specified depth within the substrate; forming a metal wiring line which extends from the surface electrode of the emitter layer to within the first via hole so as to reach a bottom portion of the first via hole; polishing a rear surface side of the substrate up to the bottom portion of the first via hole; and providing a heat sink layer made of a metal on the polished rear surface of the substrate so that the heat sink layer makes contact with the metal wiring line within the first via hole.

According to the heterojunction bipolar transistor fabricating method of this invention, the heterojunction bipolar transistor capable of reducing the heat radiation property and reducing the emitter inductance is fabricated.

In an embodiment of the invention, after forming the first via hole, an insulating film is so provided as to cover top surfaces and side surfaces of the emitter layer, the base layer and the collector layer, and the first via hole is furthermore extended toward the rear surface side of the substrate.

In the process of forming the first via hole, a long-time etching process is performed in order for the first via hole to cut through the emitter layer, the base layer and the collector layer and to reach up to a specified depth within the substrate. Therefore, there occurs a dimensional shift due to lateral expansion of the etching, which causes the device processing accuracy to lower and characteristic variations to occur. Also, there appears a rough surface in the inner wall of the first via hole i.e. rough side surfaces of the emitter layer, the base layer and the collector layer. Particularly with the use of dry etching, plasma damage would be led to the etching surfaces. Therefore, there is a possibility of deterioration in device characteristics.

Thus, in the heterojunction bipolar transistor fabricating method of this embodiment, after forming the first via hole which extends through the emitter layer, the base layer and the collector layer, an insulating film is so provided as to cover top surfaces and side surfaces of the emitter layer, the base layer and the collector layer. The first via hole is furthermore extended toward the rear surface side of the substrate. As a result, dimensional shifts of the first via hole due to the etching are suppressed, so that higher device accuracy and higher characteristic uniformization can be obtained. Further, occurrence of surface roughnesses and damage on the side surfaces of the emitter layer, the base layer and the collector layer can be eliminated. Therefore, higher device reliability can be obtained.

In an embodiment of the invention, a wet etching process or a low-power conditioned dry etching process is performed in the step of forming the first via hole, and a high-power conditioned dry etching is performed in the step of extending the first via hole toward the rear surface side of the substrate.

In the heterojunction bipolar transistor fabricating method of this embodiment, a wet etching process or a low-power conditioned dry etching process is performed in the step of forming the first via hole, so that occurrence of rough surface and damage at the side surfaces of the emitter layer, the base layer and the collector layer can be effectively prevented. Therefore, higher device reliability can be obtained. Also, a high-power conditioned dry etching is performed in the step of extending the first via hole toward the rear surface side of the substrate, so that a high-speed etching process can be achieved and the lateral expansion due to etching is suppressed. Thus, the first via hole can be deeply formed in a relatively short time.

In an embodiment of the invention, an undercut is formed by etching a lower outer-edge portion of the emitter layer in the process of patterning the emitter layer; a metal film is deposited on the top surface side of the substrate so as to form the surface electrode of the base layer, with an inner edge of the surface electrode of the base layer formed in self alignment to the emitter layer by using the undercut; and the metal film and the base layer are continuously etched with the same mask so that an outer edge of the surface electrode of the base layer and an outer edge of the base layer become coincident with each other.

In the heterojunction bipolar transistor fabricating method of this invention, since the first via hole extends through the emitter layer, the base layer and the collector layer, the individual layers and their surface electrodes surround the periphery of the first via hole in an elongate and annular form. Therefore, there is a possibility that the base wiring resistance especially increases, which causes the high-frequency characteristics of the device to deteriorate. Although the increase in base wiring resistance can be suppressed merely by broadening the width of the base layer in order to broadening the area of the surface electrode of the base layer, the base-collector capacity increases and consequently the high-frequency characteristics is lowered.

according to the heterojunction bipolar transistor fabricating method of this embodiment, an undercut is formed by etching a lower outer-edge portion of the emitter layer in the process of patterning the emitter layer, and a metal film is deposited on the top surface side of the substrate so as to form the surface electrode of the base layer, with an inner edge of the surface electrode of the base layer formed in self alignment to the emitter layer by using the undercut. In addition to this, in this embodiment, the metal film and the base layer are continuously etched with the same mask so that an outer edge of the surface electrode of the base layer and an outer edge of the base layer become coincident with each other. As a result, the width of the surface electrode of the base layer can be broadened fully to a range from the outer edge of the emitter layer to the outer edge of the base layer without broadening the width of the base layer. Consequently, increases in the base wiring resistance can be suppressed while increases in the base-collector capacity are avoided. Therefore, high-frequency characteristics of the device can be improved.

In an embodiment of the invention, the first via hole is formed after forming the surface electrodes of the collector layer and the base layer and before forming the surface electrode of the emitter layer; simultaneously with time when the surface electrode of the emitter layer is formed, a wiring pattern of a same material as that of the surface electrode is formed, the wiring pattern extending from a surface portion of the emitter layer to within the first via hole so as to reach a bottom portion of the first via hole; and the metal wiring line is formed on the wiring pattern by a plating process.

In the heterojunction bipolar transistor fabricating method of this embodiment, when forming the surface electrode of the emitter layer, the wiring pattern for plating the metal wiring line is simultaneously formed. Therefore, the process of the metal wiring line can be reduced, as compared with the case where the surface electrode of the emitter layer and the metal wiring line are patterned independently of each other. Accordingly, fabricating cost can be reduced.

In an embodiment of the invention, after forming the metal wiring line, the rear surface side of the substrate is not polished or the rear surface side of the substrate is polished to a specified extent; a second via hole is so formed as to extend from the rear surface side of the substrate up to the bottom portion of the first via hole; and the heat sink layer made of a metal is provided on the rear surface of the substrate so as to make contact with the metal wiring line within the first via hole through the second via hole.

According to the heterojunction bipolar transistor fabricating method of this embodiment, the polishing process or the rear surface of the substrate can be omitted, or needs only to be done to a small polishing extent.

In an embodiment of the invention, simultaneously with time when the first via hole is formed, an alignment hole deeper than the first via hole is formed from the top surface side of the substrate toward the rear surface side of the substrate in a region other than regions occupied by the emitter layer, the base layer and the collector layer; the rear surface of the substrate is polished up to a bottom portion of the alignment hole; and a photolithography process for forming the second via hole is performed with reference to the alignment hole appearing on the rear surface side of the substrate.

In the heterojunction bipolar transistor fabricating method of this embodiment, the second via hole to be formed from the rear surface side of the substrate can be aligned with the first via hole formed from the top surface side of the substrate with a normal aligner instead of any special device such as a double-sided aligner. Therefore, high-accuracy alignment by normal photolithography techniques can be achieved.

In an embodiment of the invention, the second via hole is formed in a conical shape which broadens toward the heat sink layer on the substrate rear surface, and an interior of the second via hole is buried with a same material as that of the heat sink layer.

Since the second via hole is formed in a conical shape which broadens toward the heat sink layer on the substrate rear surface, and buried with a same material as that of the heat sink layer, the heat radiation path substantially increases up to the heat sink layer, so that the heat radiation property can be further improved.

In an embodiment of the invention, the surface electrodes of the collector layer, the base layer and the emitter layer are each formed by a lift-off process into a patterned surface electrode which surround a periphery of a region where the first via hole is to be formed and a portion of which is cut out.

In the heterojunction bipolar transistor fabricating method of this embodiment, patterns of the surface electrodes are generally annular with part of each pattern cut out. Therefore, a solution of lift-off resist easily penetrates from outside to inside of the generally annular patterns through the cutout portions. Thus, the lift-off process can be achieved more easily, as compared with the case where the surface electrode patterns of the collector layer, the base layer and the emitter layer are completely annular patterns.

In an embodiment of the invention, in the process of polishing the rear surface of the substrate up to the bottom portion of the first via hole, the polishing process is ended, by observing electric resistance of a polishing liquid, at a time point when cut chips of the metal wiring line within the first via hole mingle into the polishing liquid, causing the electric resistance of the polishing liquid to show a change.

According to the heterojunction bipolar transistor fabricating method of this embodiment, since the end point of polishing process is determined by change in electric resistance of the polishing liquid, the end point of polishing process is clarified. Therefore, the accuracy of polishing extent on the rear surface side of the substrate is improved.

In an embodiment of the invention, a plurality of sets of the emitter layer, the base layer and the collector layer of the heterojunction bipolar transistor are arrayed on a common semiconductor substrate; and before the first via hole is formed in each heterojunction bipolar transistor, a device isolation region having a specified thickness is formed between the collector layers of adjacent heterojunction bipolar transistors by performing ion implantation.

Lamination of the emitter layer, the base layer and the collector layer of each heterojunction bipolar transistor is formed into a mesa shape in this heterojunction bipolar transistor fabricating method. Therefore, when the photolithography process is performed to form the first via hole, the film thickness of the photoresist mask would become non-uniform due to the mesa step gap, with the result that the photoresist mask becomes thin in film thickness on the uppermost emitter layer. As a result, there is a possibility that mask break may occur during the etching of the first via hole, causing the emitter layer to be etched. In addition, since merely thickening the film thickness of the photoresist mask would cause the patterning precision to lower, the photoresist mask cannot be thickened so much.

In the heterojunction bipolar transistor fabricating method of this embodiment, therefore, a device isolation region having a specified thickness is formed between the collector layers of adjacent heterojunction bipolar transistors by performing ion implantation. When the photolithography process for forming the first via hole, step gaps between the transistor portions and the field portions i.e. regions between transistors on the substrate are reduced by virtue of the thickness of the device isolation region so that the photoresist mask is uniformized in film thickness. Therefore, during the process of etching the first via hole, the possibility of occurrence of mask break can be eliminated. Still, the successful coverage property of the transistor portions can be obtained during the formation of the metal wiring line, so that the device reliability can be enhanced.

It is desirable to use anti-activated ions such as oxygen ions, helium ions, hydrogen ions, as ions to be implanted for the formation of the device isolation region, in order that the device isolation region is formed into a high-resistance region.

In an embodiment of the invention, a high-frequency transmitter or receiver includes, as a high-frequency amplifier, the heterojunction bipolar transistor, the parallel connected heterojunction bipolar transistors or the heterojunction bipolar transistor made by the heterojunction bipolar transistor fabricating method as described above.

In the high-frequency transmitter or receiver, since the high-frequency amplifier is superior in heat radiation property, high-power output operation with a high gain is enabled in high-frequency amplifications. Also, an enhanced reliability can be obtained.

BRIEF DESCRIPTION OF THE DRAWINGS

FIGS. 2A–2E are process diagrams for fabricating the HBT of FIG. 1;

FIG. 3 is a view for explaining heat dissipation paths in operation of an HBT according to a second embodiment of the invention;

FIG. 11A shows a planar pattern in a case where an isolation groove is provided between adjacent HBTs connected in parallel, the isolation groove being buried with an interlayer insulator, and FIG. 11B shows a cross section taken along a line B—B of FIG. 11A;

FIG. 12A shows a planar pattern in a case where an isolation groove is provided between adjacent HBTs connected in parallel, the isolation groove being hollow, and FIG. 12B shows a cross section taken along a line B—B of FIG. 12A;

FIGS. 13A–13C are process diagrams showing an example in which a second via hole is formed from the substrate rear surface side by dry etching in the fabrication of the HBT shown in FIG. 4;

FIG. 21A is a circuit diagram of a high-frequency two-stage amplifier equipped with any of the above HBTs, and FIG. 21B shows a portable telephone on which the high-frequency two-stage amplifier is mounted; and FIG. 22A shows a planar pattern of conventional HBTs connected in parallel, and FIG. 22B shows a cross section taken along a line B—B of FIG. 22A.

DETAILED DESCRIPTION OF THE PREFERRED EMBODIMENTS

Hereinbelow, the present invention is described in detail by way of embodiments thereof illustrated in the accompanying drawings.

First Embodiment

Figure 1A:
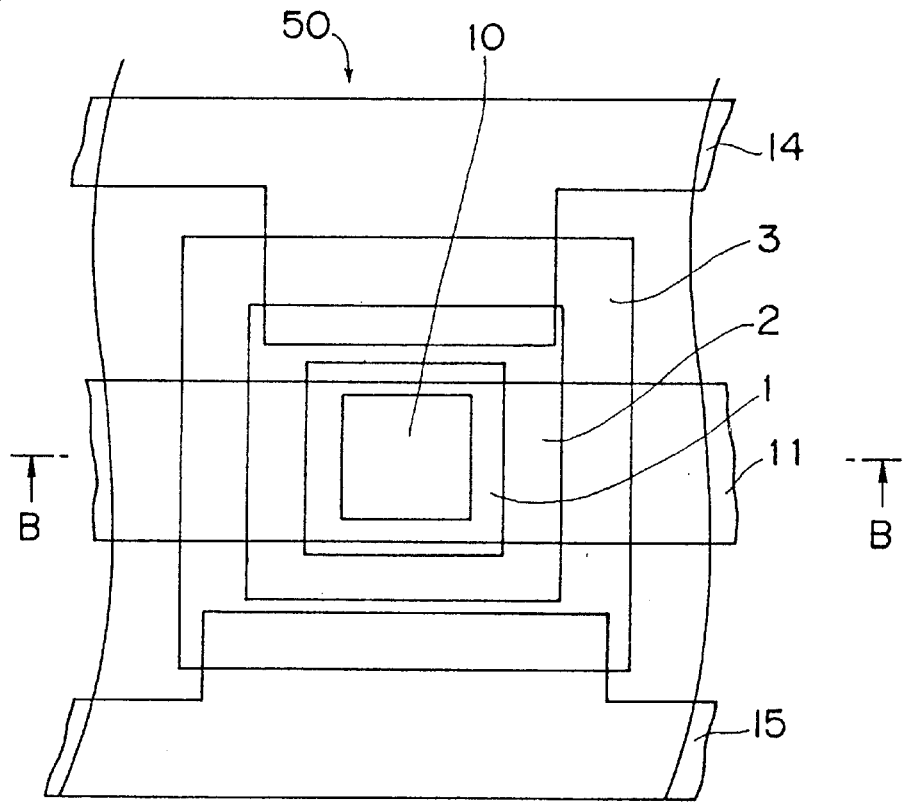
FIG. 1A shows a planar pattern of an HBT according to a first embodiment of the present invention.
Figure 1B:
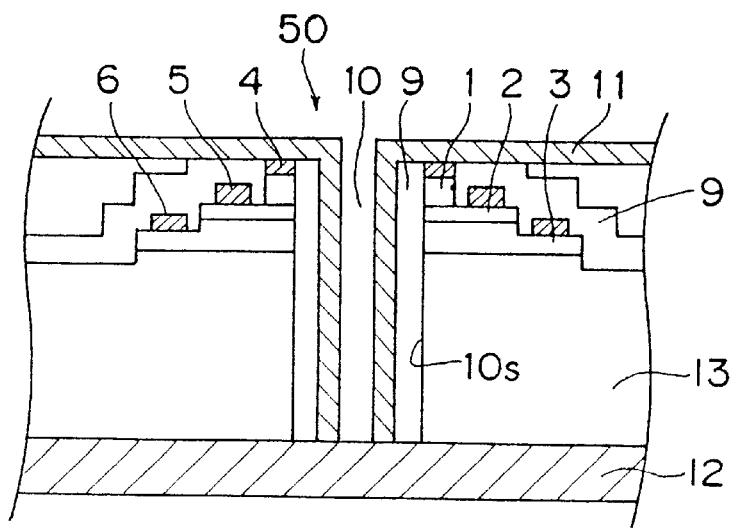
FIG. 1B shows a cross section taken along a line B—B of FIG. 1A.

FIG. 1A shows a planar pattern of an HBT (heterojunction bipolar transistor) 50 according to a first embodiment of the present invention, and FIG. 1B shows a cross section taken along a line B—B of FIG. 1A.

This HBT 50 has an emitter layer 1 made of n-GaAs or the like, a base layer 2 made of $p^+$-GaAs or the like, and a collector layer 3 made of n-GaAs or the like, which are laminated on a top surface side of a semi-insulating GaAs substrate 13, as well as a plated heat sink layer (hereinafter, referred to as "PHS layer") 12 made of metal and provided on a rear surface of the substrate 13.

The collector layer 3, the base layer 2 and the emitter layer 1 are laminated in this order, as viewed from below, and fabricated into a mesa state in a concentric rectangular pattern so that the area of the layers 1, 2 and 3 may become smaller with increasing altitude of the layers 1, 2 and 3. At the surfaces of the layers 1, 2 and 3, several hundred nm thick surface electrodes 4, 5 and 6 for ohmic contact (hereinafter, referred to as "ohmic electrode") are formed, respectively. WN film or WN/Ti/Au multilayer film is adopted for the emitter ohmic electrode 4, Pt film or Pt/Ti/Pt/Au multilayer metal film is adopted for the base ohmic electrode 5, and AuGe film or AuGe/Ni/Au multilayer film is adopted for the collector ohmic electrode 6. Although not shown in FIG. 1A, these ohmic electrodes 4, 5, 6 are each patterned into a rectangular frame shape.

A via hole 10 is provided through central portions of the emitter layer 1, the base layer 2 and the collector layer 3. The via hole 10 has a rectangular shape in cross section concentric with the layers 1, 2, 3. The via hole 10 extends, with constant cross-sectional dimensions, from the top surface of the emitter layer 1 to the rear surface of the substrate 13. A side wall 10s of the via hole 10 is covered with an interlayer insulator 9 in order to protect side walls of the layers 1, 2, 3.

The emitter ohmic electrode 4 and the PHS layer 12 are connected to each other with a metal wiring line 11 passing through in the via hole 10. Because the emitter ohmic electrode 4 and an opening of the via hole 10 are very close to each other, the metal wiring line 11 is led from the emitter ohmic electrode 4 into the via hole 10 at a very short distance.

In this HBT 50, heat is generated during operation at junctions (mainly, an interface between the base layer 2 and the collector layer 3) on the top surface side of the semiconductor substrate 13. The heat is dissipated through two paths. One of the paths is a path along which the heat conducts from the above-mentioned junction to the metal wiring line 11 on the substrate top surface side by way of the emitter ohmic electrode 4, and further conducts from the metal wiring line 11 within the via hole 10 to the PHS layer 12 on the substrate rear surface side. The other path is a path along which the heat conducts from the junction, by way of the interior of the substrate 13 and the interlayer insulator 9 on the via hole side wall 10s, to the metal wiring line 11 within the via hole 10, and further conducts from there to the PHS layer 12 on the substrate rear surface side. Since the heat generated at the junction is dissipated through two paths as described above, heat radiation property of the HBT 50 is improved. Also, since the metal wiring line 11 is led from the emitter ohmic electrode 4 into the via hole 10 at a very short distance, emitter inductance is reduced and high-frequency characteristics are improved, as compared with the case where a conventional air bridge is used.

This HBT 50 is fabricated as follows.

First, as shown in FIG. 2A, a collector layer 3, a base layer 2 and an emitter layer 1 of specified compositions and thicknesses are laminated on top of a semi-insulating GaAs substrate 13 by epitaxial growth process (alternatively, a commercially available wafer on which these layers 3, 2, 1 have already been laminated may be used). Next, the emitter layer 1, the base layer 2 and the collector layer 3 are patterned by wet etching using an citric-acid-based or other etching solution or by RIE (Reactive Ion Etching) or other dry etching using a chlorine-based gas or the like, respectively, in such a manner that the area of layers 1, 2 and 3 becomes smaller with increasing altitude of the layers 1, 2 and 3. In this example, the length of each side of the emitter layer 1 is set to about 50 μm. In addition to this, as shown in FIG. 2B, ohmic electrodes 4, 5, 6 having rectangular frame patterns are formed at the surfaces of the layers 1, 2, 3 by lift-off technology, respectively.

Next, as shown in FIG. 2C, after a resist mask 7 is formed by performing a photolithography process, a via hole 10 is formed by performing an RIE or other dry etching process. The via hole 10 extends through center portions of the emitter layer 1, the base layer 2 and the collector layer 3 and ends at a specified depth, for example, a depth of 100 μm. In this example, the width of each side of the emitter layer 1 is set to about 4 μm. As a result, the emitter layer 1 is formed into a rectangular shape having each side length of about 50 μm and a width of about 4 pim.

HBT has each side length of about 200 μm.

Next, as shown in FIG. 2D, an interlayer insulator 9 made of, for example, SiN, SiO$_2$, SiON, polyimide resin or the like is deposited on top of the substrate 13 uniformly in a thickness of several hundred nm by plasma CVD or other process so as to cover even an inner wall 10s of the via hole 10. Subsequently, portions of the interlayer insulator 9 present on the top surface of the emitter ohmic electrode 4 and on the bottom surface of the via hole 10 are removed by preforming photolithography and etching processes so that the top surface of the emitter ohmic electrode 4 and the bottom surface of the via hole 10 are exposed.

Next, the material of a metal wiring line 11, for example, gold is uniformly deposited in about 10 μm thickness on top of the substrate 13 by vapor deposition, sputtering, plating or other process so as to cover even the interlayer insulator 9 within the via hole 10. Then, a metal wiring line 11 is formed by patterning this gold so as to extend from the emitter ohmic electrode 4 to within the via hole 10 and to reach the bottom surface of the via hole 10.

Next, as shown in FIG. 2E, the rear surface side of the substrate 13 is polished up to the bottom of the via hole 10 by CMP (Chemical Mechanical Polishing) process or the like. Then, an about 10 μm thick PHS layer 12 made of, for example, gold is provided on the polished rear surface of the substrate 13 by vapor deposition, sputtering, plating or other process so as for the PHS layer 12 to keep in contact with the metal wiring line 11 within the via hole 10.

After this, as shown in FIG. 1A, a Ti/Au lamination film having a thickness of, for example, about 10 μm is deposited on top of the substrate 13 by vapor deposition, sputtering or other process. By patterning the lamination film, a base lead line 14 in contact with the base ohmic electrode 5 is formed and a collector lead line 15 in contact with the collector ohmic electrode 6 is formed.

In this way, the heat radiation property of HBT 50 is improved and the emitter inductance thereof is reduced.

Second Embodiment

Figure 4A:
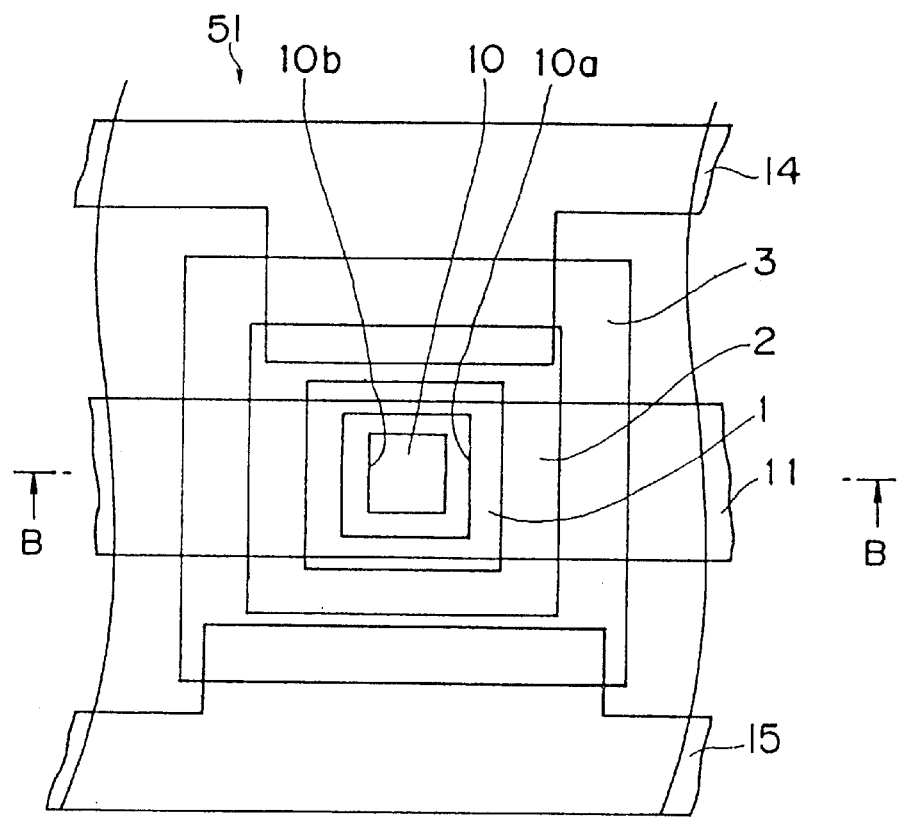
FIG. 4A shows a planar pattern of an HBT according to the second embodiment of the invention.
Figure 4B:
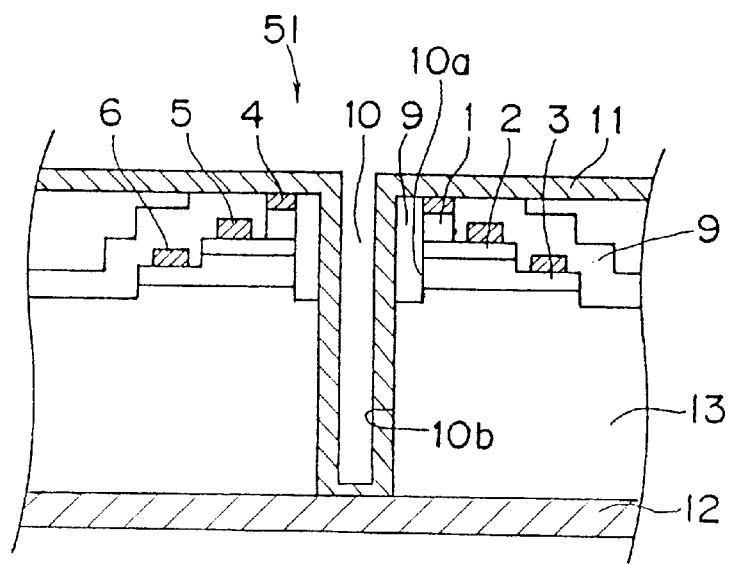
FIG. 4B shows a cross section taken along a line B—B of FIG. 4A.

FIG. 4A shows a planar pattern of an HBT 51 according to a second embodiment of the present invention. FIG. 4B shows a cross section taken along a line B—B of FIG. 4A. For an easier understanding, component elements corresponding to the component elements of FIGS. 1A and 1B are designated by the same reference numerals (the same in the case of other figures).

A via hole 10 of this HBT 51 is formed into two stages which consist of a first via hole 10a and a second via hole 10b. The first via hole 10a has constant cross sectional dimensions and extends through an emitter layer 1, a base layer 2 and a collector layer 3. A second via hole 10b has constant cross-sectional dimensions smaller than those of the first via hole 10a. The first via hole 10a is cut through the emitter layer 1, the base layer 2 and the collector layer 3, ending at a depth near the collector layer 3. The second via hole 10b reaches from the bottom of the first via hole 10a to the rear surface of a substrate 13. The interlayer insulator 9 is provided only on a side wall of the first via hole 10a, and a side wall of the second via hole 10b is in contact with the metal wiring line 11. The rest of constitution is the same as in the HBT 50 of the first embodiment.

In this HBT 51, heat radiation property can be further improved, as compared with that of the HBT 50 of the first embodiment. As schematically shown in FIG. 3, heat is generated during operation at junctions (mainly, an interface between the base layer 2 and the collector layer 3) 27 on the top surface side of the semiconductor substrate 13. The heat is dissipated through two paths P1, P2. The heat dissipation of through the paths P1, P2 is the same as that in the first embodiment. The one path P1 is a path along which the heat conducts from the junction 27 to the metal wiring line 11 on the top surface side of the substrate by way of the emitter ohmic electrode 4, and further conducts from the metal wiring line 11 within the via hole 10 to the PHS layer 12 on the rear surface of the substrate. The other path P2 is a path along which the heat conducts from the junction 27 through the interior of the substrate 13 to the metal wiring line 11 within the via hole 10, and the heat further conducts from there to the PHS layer 12 on the rear surface of the substrate. The path P2 of this embodiment, unlike the first embodiment, allows the heat to conduct from the substrate 13 directly to the metal wiring line 11 without the interlayer insulator 9. Therefore, heat radiation property of the HBT 51 in this embodiment is further improved, as compared with that of the HBT 50 in the first embodiment.

This HBT 51 is fabricated as follows.

Figure 5A:
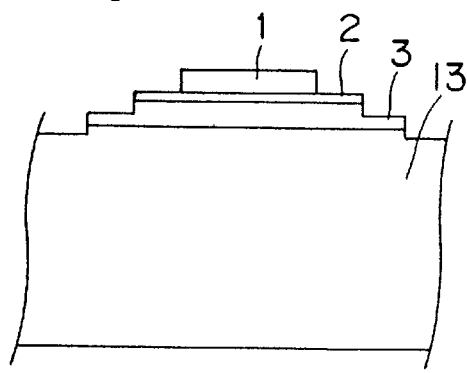
FIGS. 5A–5F are process diagrams for fabricating the HBT of FIG. 4.
Figure 5B:
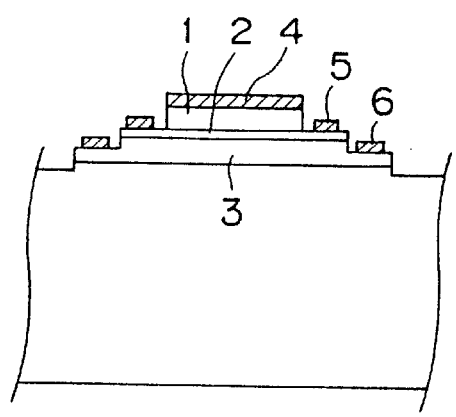

First, as shown in FIG. 5A, like the first embodiment, a collector layer 3, a base layer 2 and an emitter layer 1 are laminated in this order on top of a semi-insulating GaAs substrate 13. The layers 1, 2 and 3 are patterned so that an area of the layers 1, 2 and 3 may become smaller with increasing altitude of the layers 1, 2 and 3. In this example, the length of each side of the emitter layer 1 is set to about 50 μm. In addition to this, as shown in FIG. 5B, ohmic electrodes 4, 5, 6 having rectangular frame patterns are formed at the surfaces of the layers 1, 2, 3 by lift-off technology, respectively.

Figure 5C:
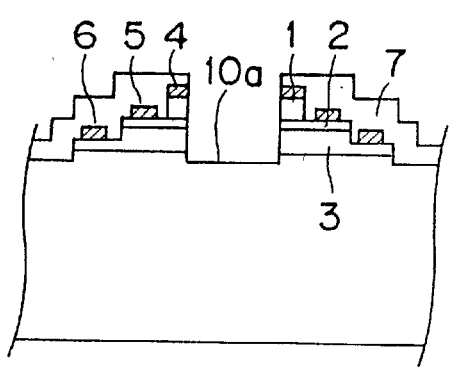

Next, as shown in FIG. 5C, after a resist mask 7 is formed by performing a photolithography process, a first via hole 10a having a rectangular shape in cross section is formed by performing dry etching process such as an RIE using chlorine-based gas or the like. The first via hole 10a extends through center portions of the emitter layer 1, the base layer 2 and the collector layer 3, and ends at a specified depth, which is several μm deeper than the depth of the collector layer 3. In this example, the length of each side of the first via hole 10a is set to about 40 μm. As a result, the emitter layer 1 is formed into a rectangular shape having a side length of about 50 μm and a width of about 4 μm. In this first step at which the first via hole 10a is formed, dry etching process is performed under the condition of very low RF power, for example, about 10 W. As a result of this, the emitter layer 1, the base layer 2 and the collector layer 3 can be effectively prevented from occurrence of surface roughnesses and damage on their side surfaces. Therefore, the device reliability can be enhanced.

Figure 5D:
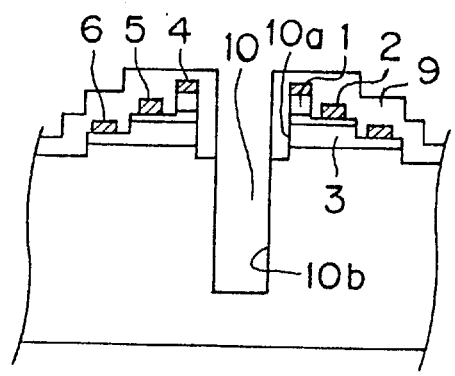

Next, as shown in FIG. 5D, an interlayer insulator 9 made of, for example, SiN, SiO$_2$, SiON, polyimide resin or the like is deposited on top of the substrate 13 uniformly in a thickness of several hundred nm by plasma CVD or other process so as to cover even an inner wall of the first via hole 10a. Subsequently, a second via hole 10b ending at a specified depth, for example, a depth of about 100 μm within the substrate 13 is formed at a site several μm inward of the bottom of the first via hole 10a by performing an RIE or other dry etching process. In this example, the second via hole 10b is formed with the length of each side set to about 30 μm, concentrically with the first via hole 10a. As a result, the first via hole 10a is extended toward the rear surface of the substrate 13. In this second stage at which the second via hole 10b is formed, dry etching process is performed under a high power condition of, for example, 100 W RF power. As a result of this, high-speed etching can be executed while lateral expansion of etching is suppressed, so that a deep via hole 10 can be formed in relatively short time. Therefore, the device dimensional accuracy can be improved, and moreover the number of fabricating steps can be reduced.

Figure 5E:
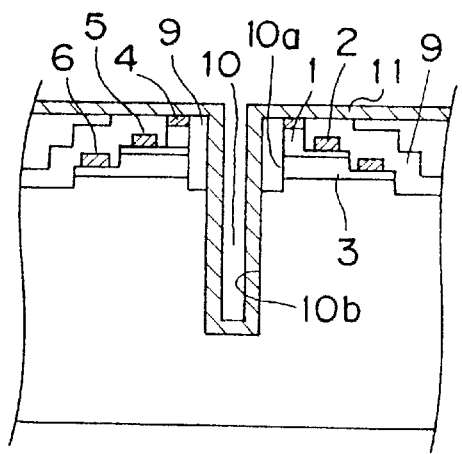

Next, as shown in FIG. 5E, portions of the interlayer insulator 9 present on the top surface of the emitter ohmic electrode 4 and the bottom surface of the via hole 10 are removed by preforming photolithography and etching processes so that the top surface of the emitter ohmic electrode 4 and the bottom surface of the via hole 10 are exposed.

Figure 5F:
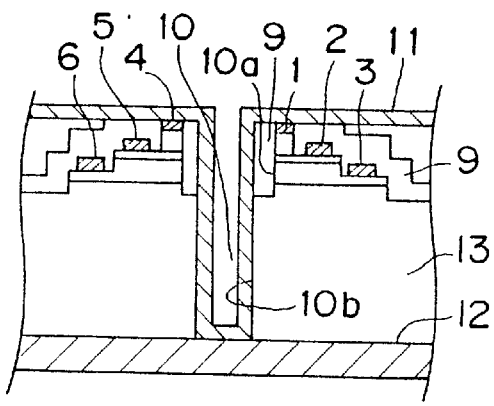

After this, in the same way as the first embodiment, a metal wiring line 11 is formed to extend from the emitter ohmic electrode 4 to within the via hole 10 and each the bottom surface of the via hole 10. Further, as shown in FIG. 5F, the rear surface side of the substrate 13 is polished up to the bottom of the via hole 10, and an about 10 μm thick PHS layer 12 made of, for example, gold is provided on the polished rear surface of the substrate 13.

In this way, an HBT 51 capable of improving heat radiation property and reducing the emitter inductance is fabricated.

Third Embodiment

Figure 6A:
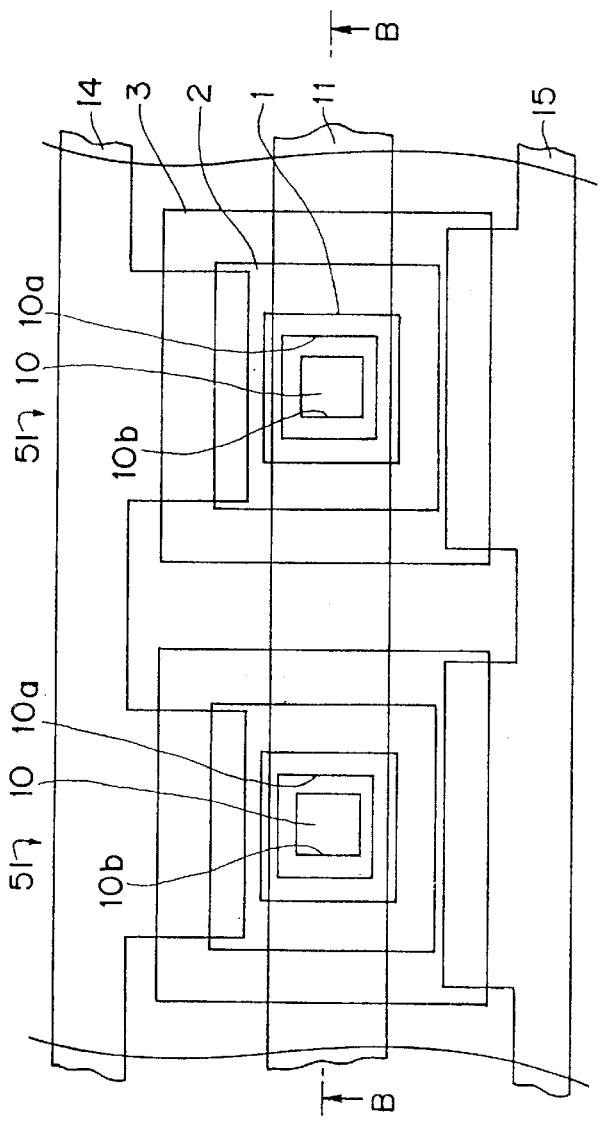
FIG. 6A shows a planar pattern of HBTs connected in parallel according to a third embodiment of the invention.
Figure 6B:
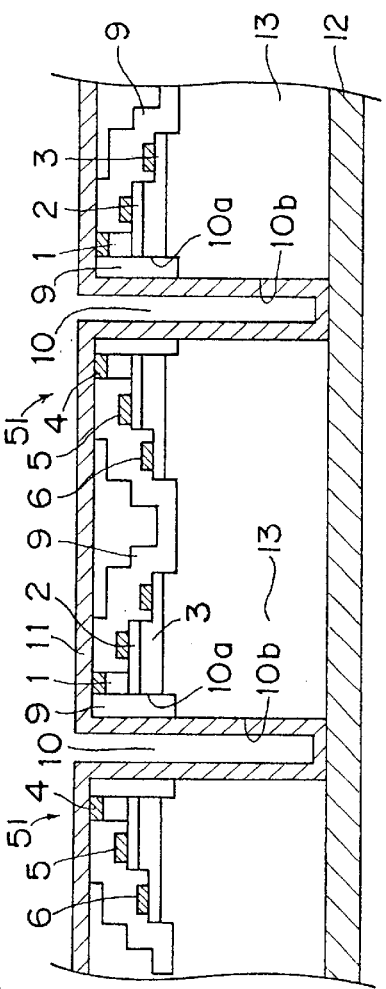
FIG. 6B shows a cross section taken along a line B—B of FIG. 6A.

FIG. 6A shows a planar pattern of HBTs connected in parallel, and FIG. 6B shows a cross section taken along a line B—B of FIG. 6A.

In this example, the HBTs 51 of the second embodiment are arrayed on a common semiconductor substrate 13. A metal wiring lines 11, a base wiring line 14 and a collector wiring line 15 are electrically connected to each other so as for adjacent HBTs 51 to enable parallel operations. Therefore, high-power operation is enabled. Also, heat generated at junctions of the HBTs 51 is released to a PHS layer 12 on the substrate rear surface every HBT. Accordingly, heat concentration due to performance variations among the HBTs is suppressed so that the reliability is improved.

It is noted that, in this example, the metal wiring line 11, the base wiring line 14 and the collector wiring line 15 are formed of about 1 μm thick Au or Ti/Au or other lamination film so as to be suited for patterning.

Fourth Embodiment

Figure 7A:
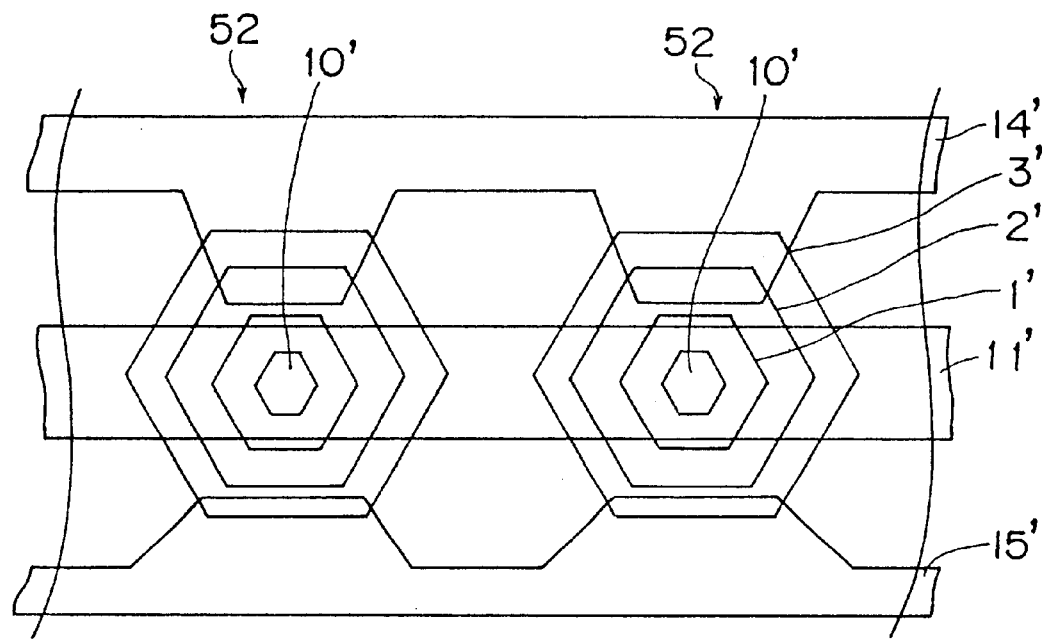
FIG. 7A shows a planar pattern of HBTs each having a regular hexagonal pattern and connected in parallel according to the third embodiment of the invention.
Figure 7B:
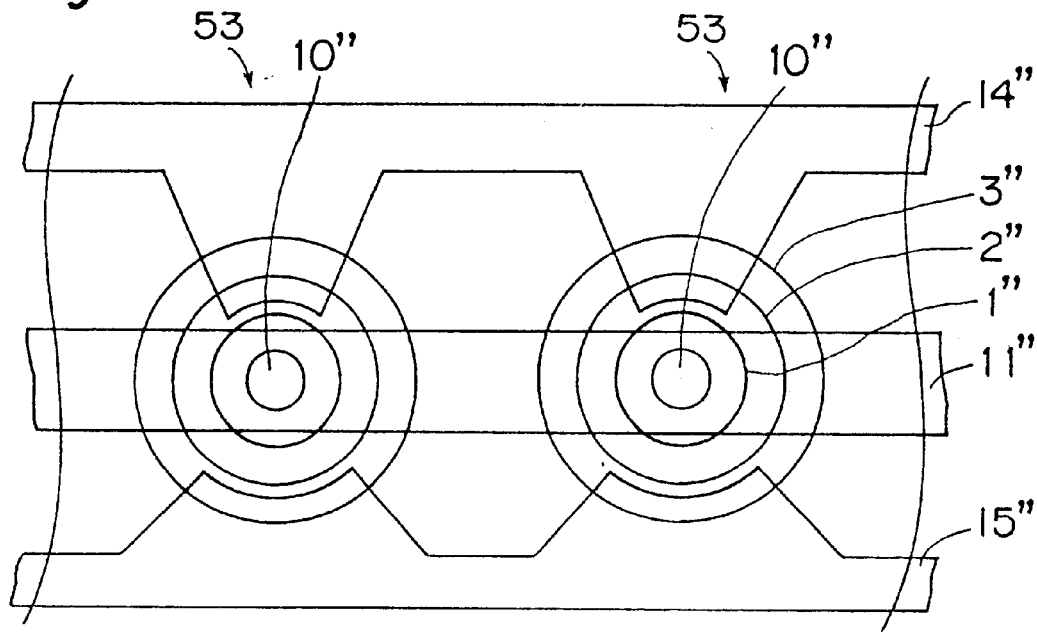
FIG. 7B shows a planar pattern of HBTs each having a circular pattern and connected in parallel.

FIG. 7A shows HBTs 52 each having a regular hexagonal pattern and connected in parallel, and FIG. 7B shows HBTs 53 each having a circular pattern and connected in parallel.

In the HBT 52 of FIG. 7A, an emitter layer 1', a base layer 2', a collector layer 3' and a via hole 10' extending through those layers 1', 2', 3' each have a regular hexagonal pattern. The rest of constitution is the same as in the HBT 50 of the first embodiment. In this HBT 52, since the via hole 10' has a cross-sectional configuration set to a regular hexagon in which apex angles are obtuse angles, electric field concentration at peripheries of the via hole 10' is suppressed. Therefore, the device reliability is improved. As a matter of course, if the cross-sectional configuration is a polygon in which apex angles are obtuse angles, similar functional effects can be produced.

Also, in the HBT 53 of FIG. 7B, an emitter layer 1", a base layer 2", a collector layer 3" and a via hole 10" extending through those layers 1", 2", 3" each have a circular pattern. The rest of constitution is the same as in the HBT 50 of the first embodiment. In this HBT 53, since the via hole 10" has a cross-sectional configuration set to a circular shape, electric field concentration at peripheries of the via hole 10" is suppressed. Therefore, the device reliability is improved.

Fifth Embodiment

Figure 8:
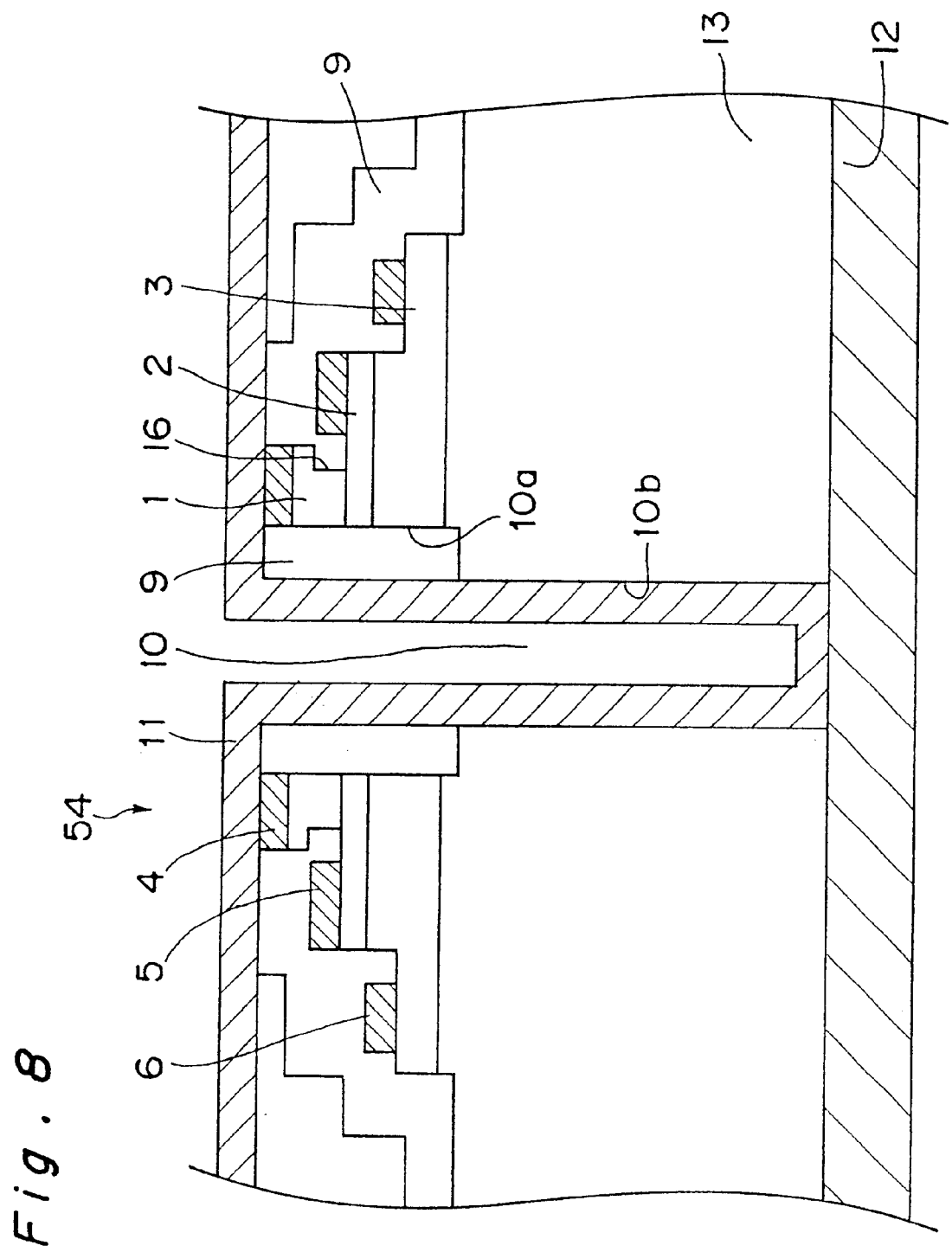
FIG. 8 is a sectional view showing an HBT according to a fifth embodiment of the invention.

FIG. 8 shows a cross section of an HBT 54 according to a fifth embodiment of the present invention. This HBT 54 differs from the HBT 51 of the second embodiment only in that an undercut 16 is formed at a lower outer-edge portion of an emitter layer 1 and that a base ohmic electrode 5 is formed in self alignment.

This HBT 54 is fabricated as follows.

Figure 9A:
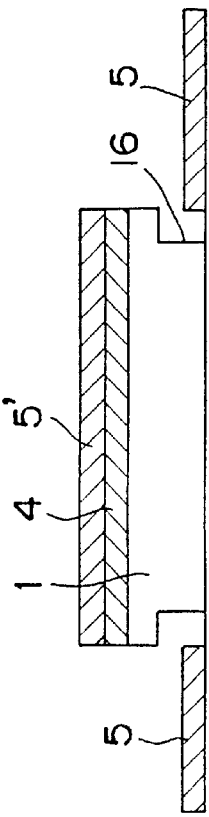
FIGS. 9A–9D are process diagrams for fabricating the HBT of FIG. 8.

When the emitter layer 1 is patterned according to the fabricating process of the second embodiment, the emitter layer 1 is side-etched at its lower outer-edge portion to about 0.2 μm, by which an undercut (step gap) 16 is formed as shown in FIG. 9A.

Figure 9B:
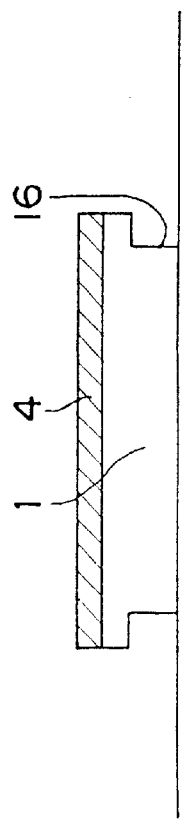

Next, as shown in FIG. 9B, metal films 5, 5' such as Pt films or Pt/Ti/Pt/Au lamination films with a thickness of about several hundred nm are deposited on top of the substrate 13 in order to make the base ohmic electrodes. As a result, inner edges of the base ohmic electrode 5 are formed in self alignment to the emitter layer 1 by using the step gap at the outer edge of the emitter layer 1. In this case, the metal film 5' forms part of the emitter ohmic electrode 4. The metal films 5' is omitted in the illustration of FIG. 8.

Figure 9D:
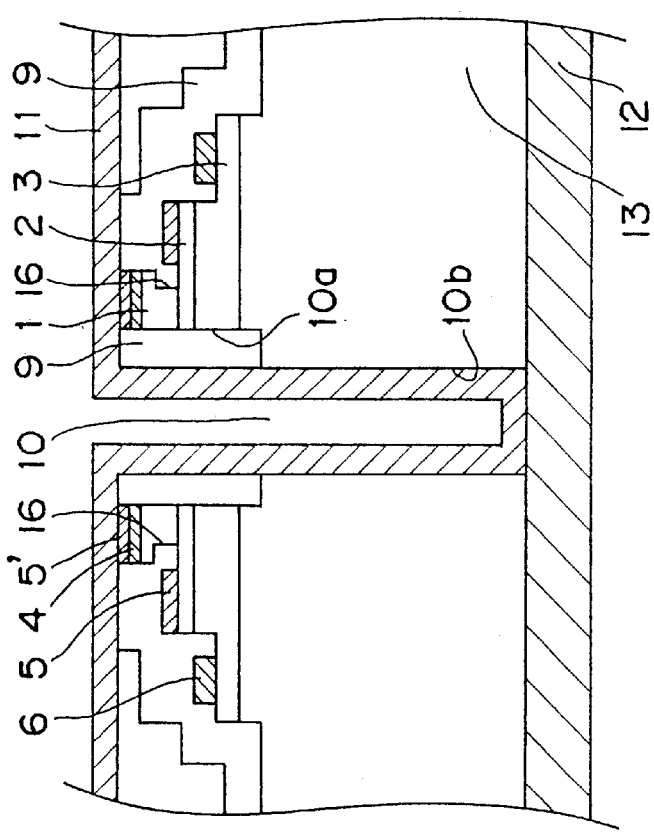
Figure 9C:
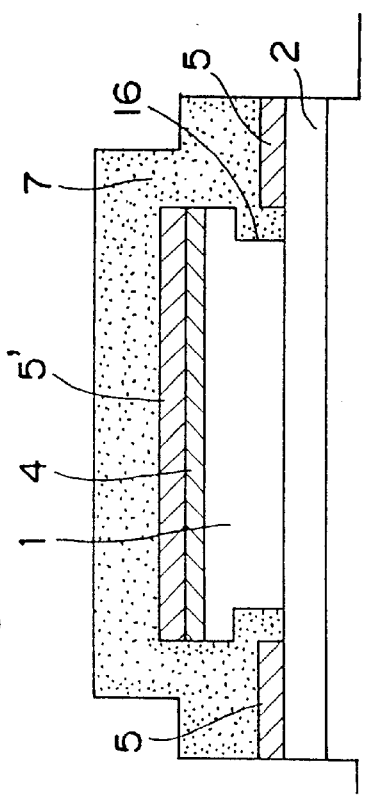

Next, as shown in FIG. 9C, by performing a photolithography process, photoresist (mesa-etching mask) 7 for patterning of the base layer 2 is provided so as to cover the emitter ohmic electrode 4 and the metal film 5. Then, the metal film 5 and the base layer 2 are patterned by continuously performing dry etching processes such as RIE with the use of the same mask 7 so that the outer edge of the base ohmic electrode 5 and the outer edge of the base layer 2 become coincident with each other. As etching conditions for these processes, for example, sputtering etching conditions for Ar are adopted because the metal film 5 contains a Pt layer at the stage of etching the metal film 5. Next, at the stage of etching the base layer 2, conditions by making use of chemical reaction with chlorine-based gas are adopted.

After this, the same processes as those in the second embodiment are executed to obtain an HBT as shown in FIG. 9D i.e. FIG. 8.

According to this HBT fabricating method, the width of the base ohmic electrode 5 can be broadened fully to a range from the outer edge of the emitter layer 1 to the outer edge of the base layer 2 without broadening the width of the base layer 2. As a result, increases in the base wiring resistance can be suppressed while increases in the base-collector capacity are avoided. Therefore, high-frequency characteristics of the device can be improved.

Sixth Embodiment

Figure 10:
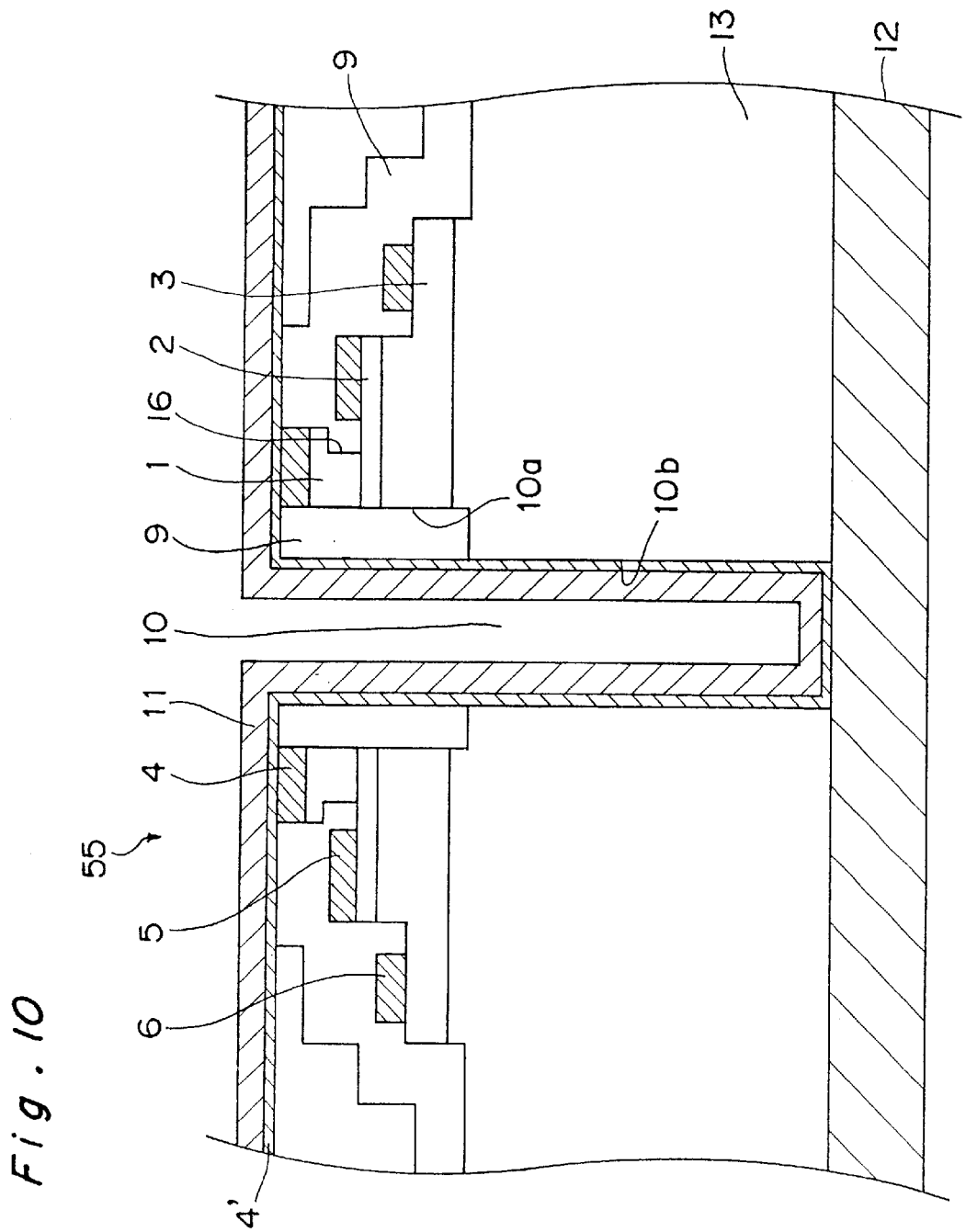
FIG. 10 is a sectional view showing an HBT according to a sixth embodiment of the invention.

FIG. 10 shows a cross section of an HBT 55 according to a sixth embodiment of the present invention. This HBT 55 differs from the HBT 54 of the fifth embodiment only in that a metal wiring line 11 is formed by plating process on a wiring pattern 4' made of material of the emitter ohmic electrode 4. The emitter ohmic electrode 4 and the wiring pattern 4' are formed of, for example, several hundred nm thick WN film or WN/Ti/Au multilayer film.

For fabrication of this HBT 55, after the collector ohmic electrode 6 and the base ohmic electrode 5 are formed and before the emitter ohmic electrode 4 is formed, a first via hole 10a is formed. Next, a wiring pattern 4' is formed by vapor deposition or other process, simultaneously with formation of the emitter ohmic electrode 4. The wiring pattern 4' is made of the material of the emitter ohmic electrode 4, and extends from the top surface of the emitter layer 1 to within the first via hole 10a, reaching the bottom surface of the first via hole 10a. Then, with the wiring pattern 4' used as a power-feeding metal, a metal wiring line 11 is formed on the wiring pattern 4' by plating process. The rest of processes are executed in the same manner as in the fifth embodiment.

In this fabricating method, since the wiring pattern 4' for plating the metal wiring line 11 is formed simultaneously when the emitter ohmic electrode 4 is formed, the processes can be reduced, as compared with the case where the emitter ohmic electrode 4 and the metal wiring line 11 are patterned independently of each other. Therefore, the fabricating cost can be reduced.

Seventh Embodiment

FIG. 11A shows a planar pattern in a case where an isolation groove 17 is provided between HBTs 51 connected in parallel, and FIG. 11B shows a cross section taken along a line B—B of FIG. 11A.

In this example, like the third embodiment, a metal wiring lines 11, a base wiring line 14 and a collector wiring line 15 are electrically connected to each other so as for adjacent HBTs 51 to enable parallel operations. Therefore, high-power operation is enabled. Also, heat generated at junctions of the HBTs 51 is released to the PHS layer 12 on the substrate rear surface every HBT. Accordingly, heat concentration due to performance variations among the HBTs is suppressed so that the reliability is improved.

The isolation groove 17 that extends from top surface to rear surface of the substrate to partition adjacent HBTs 51 from each other is provided in a common semiconductor substrate 13, and the interior of the isolation groove 17 is buried with the interlayer insulator 9. The isolation groove 17 is formed simultaneously with the via hole 10. By this structure, adjacent HBTs 51 are thermally shielded from each other during operation, thus never affecting each other, and moreover the HBTs 51 are uniformized in heat capacity, thus operating uniformly. Therefore, the device reliability can be improved.

Similarly, FIG. 12A shows a planar pattern in a case where an isolation groove 17 is provided between HBTs connected in parallel, and FIG. 12B shows a cross section taken along a line B—B of FIG. 12A.

In this example, the isolation groove 17 is hollow with nothing buried therein. Like the foregoing example, adjacent HBTs 51 are thermally shielded from each other during operation, thus never affecting each other, and moreover the HBTs 51 are uniformized in heat capacity, thus operating uniformly. Therefore, the device reliability can be improved.

It is also possible to bury a metal smaller in heat conductivity than the substrate 13 in the isolation groove 17. In such a case, heat generated at each HBT 51 conducts along the metal, being released to the PHS layer 12 on the substrate rear surface. Therefore, heat radiation property can be further improved and the device can be prevented from damage due to heat generation. As shown above, by providing the isolation groove 17, the device reliability can be enhanced.

Eighth Embodiment

FIGS. 13A to 13C show an example in which a second via hole 10b having constant cross-sectional dimensions is formed from the rear surface side of a substrate 13, differently from the fabrication of the HBT 51 shown in FIG. 4.

In this example, as shown in FIG. 13A, like the second embodiment, a first via hole 10a is formed, further an interlayer insulator 9 is formed, and thereafter a metal wiring line 11 is formed. Next, the rear surface side of the substrate 13 is polished to a specified extent by CMP or the like so that the substrate 13 is thinned to a thickness of, for example, 100

μm Subsequently, as shown in FIG. 13B, the second via hole 10b ranging from the rear surface side of the substrate 13 up to the bottom of the first via hole 10a is formed by performing photolithography and RIE or other dry etching process. Then, as shown in FIG. 13C, by vapor deposition, sputtering, plating or other process, an about 10 μm thick PHS layer 12 made of, for example, gold is provided on the polished rear surface of the substrate so as to keep in contact with the metal wiring line 11 within the first via hole 10a through the second via hole 10b.

Figure 14A:
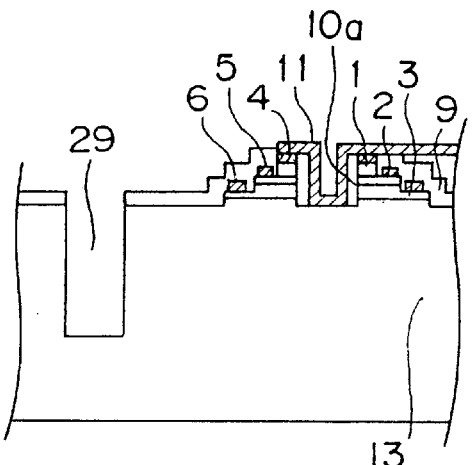
FIGS. 14A–14F are process diagrams showing details of the process diagrams of FIGS. 13A–13C.
Figure 14B:
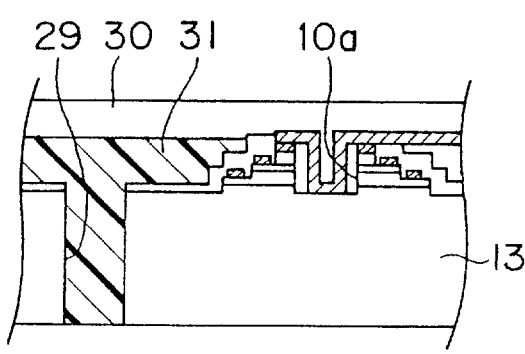
Figure 14C:
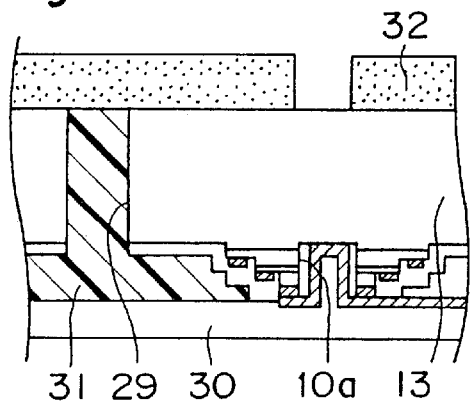

More specifically, first, as shown in FIG. 14A, simultaneously when a first via hole 10a extending through the emitter layer 1, the base layer 2 and the collector layer 3 and ending at a specified depth within the substrate 13 is formed, an alignment hole 29 deeper than the first via hole 10a is formed from the substrate top surface side in a region on the substrate 13 other than regions occupied by the layers 1, 2, 3. In this example, the depth of the alignment hole 29 is set to about 100 μm. Next, as shown in FIG. 14B, a holding substrate 30 made of, for example, Si is bonded to the top surface side of the substrate 13 with resin 31. In this process, the alignment hole 29 is buried with the resin 31. Next, by CMP or other process, the substrate 13 is polished at its rear surface side up to the bottom of the alignment hole 29, i.e., until the resin 31 at the bottom of the alignment hole 29 appears on the rear surface side of the substrate 13. As shown in FIG. 14C, by performing a photolithography process by referencing the alignment hole 29 (resin 31) that has appeared on the rear surface side of the substrate 13, a resist mask 32 for forming the second via hole 10b is substrate 13, the second via hole 10b may also be formed with the polishing process omitted.

Figure 15:
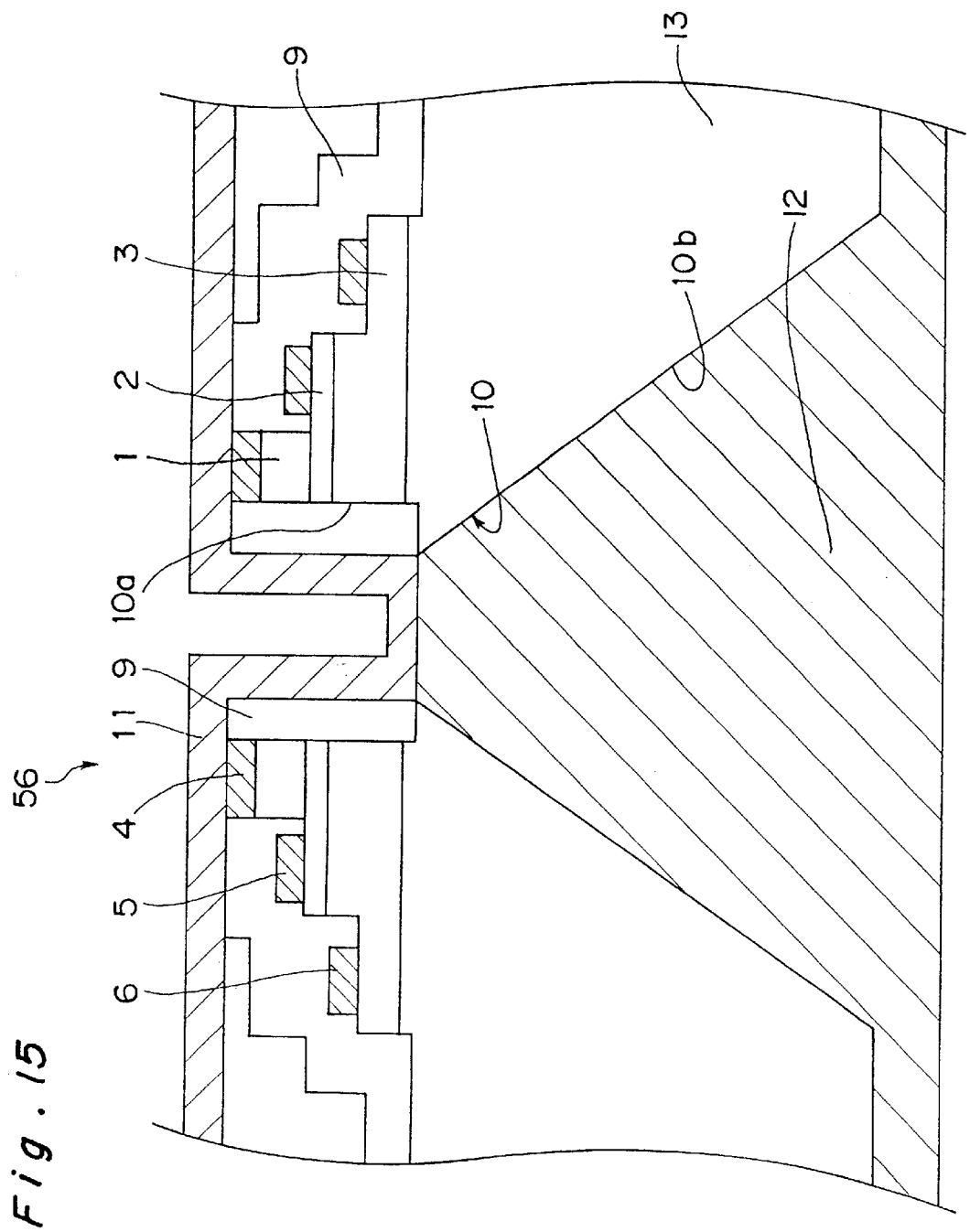
FIG. 15 is a sectional view showing an HBT obtained by forming a second via hole from the substrate rear surface side by wet etching.

FIG. 15 shows an example in which the second via hole 10b is formed in a conical shape from the substrate rear surface side by wet etching with the use of such etchant as an citric-acid base in place of the above RIE or other dry etching. An interior of the second via hole is buried with the same material as that of the heat sink layer.

In this example, in the fabricated HBT 56, because the second via hole 10b broadens toward the PHS layer 12 on the substrate rear surface, the heat path to the PHS layer 12 substantially decreases. Therefore, heat radiation property can be further improved and the device reliability can be further enhanced.

Ninth Embodiment

Figure 16:
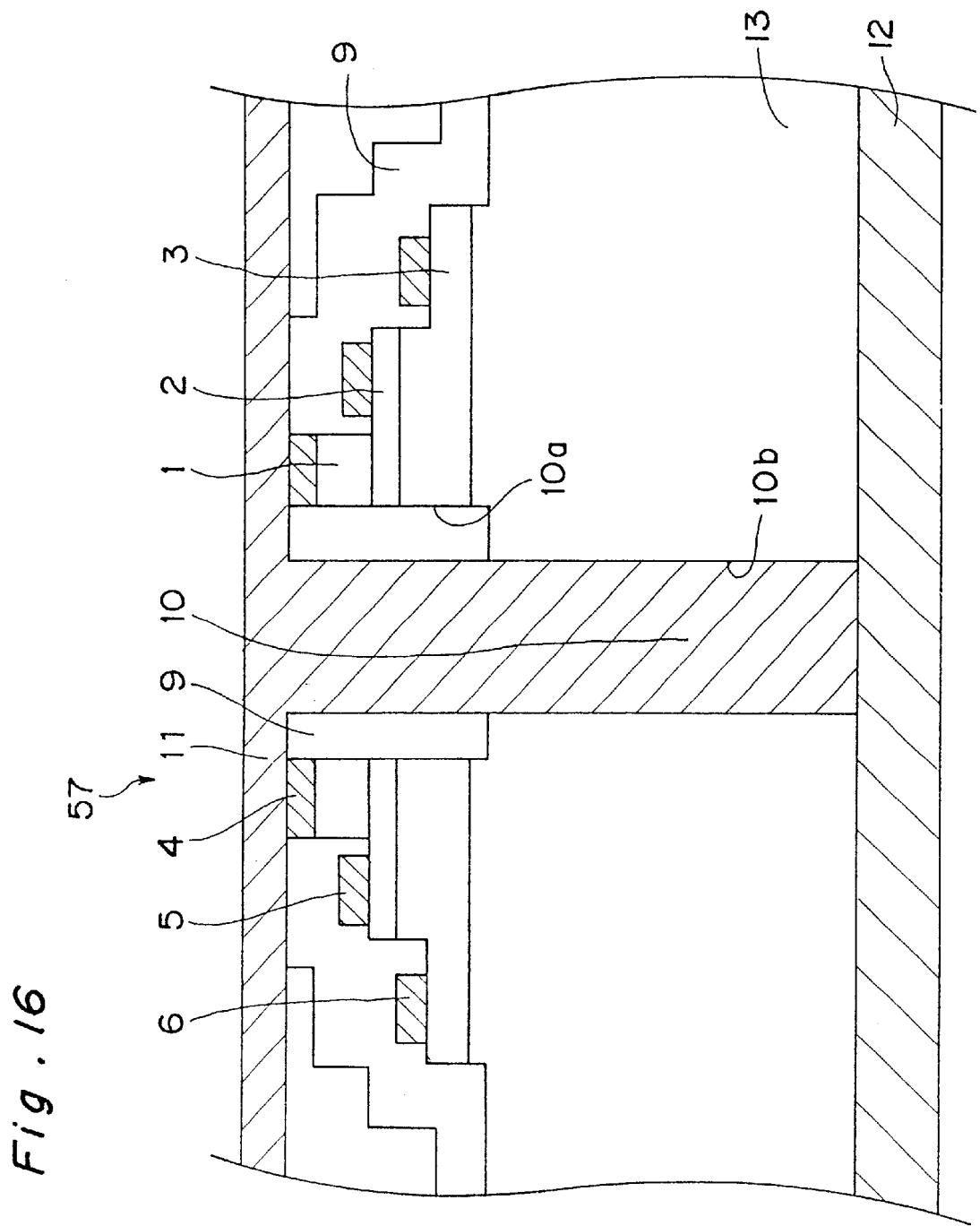
FIG. 16 is a sectional view showing an HBT according to a ninth embodiment of the invention.

FIG. 16 shows a cross section of an HBT 57 according to a ninth embodiment of the present invention. This HBT 57 differs from the HBT 51 of the second embodiment only in that the interior of the via hole 10 is fully buried with the same material as that of the metal wiring line 11. Such a metal wiring line 11 is formed by plating process.

Figure 14D:
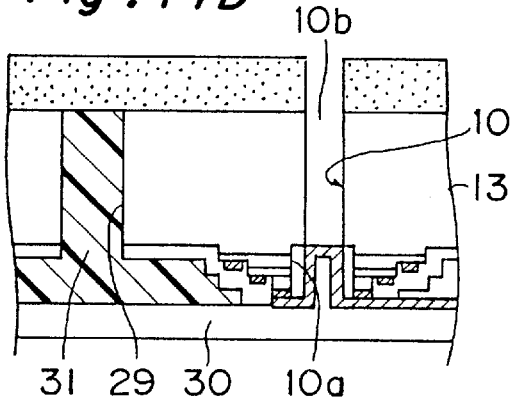
Figure 14E:
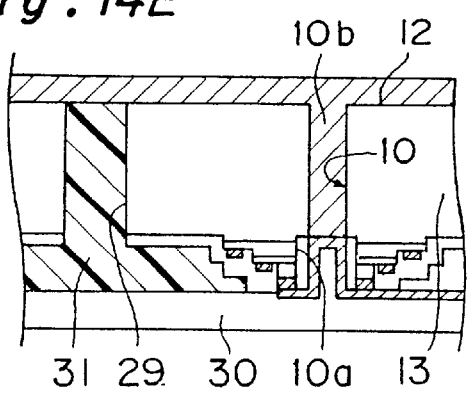
Figure 14F:
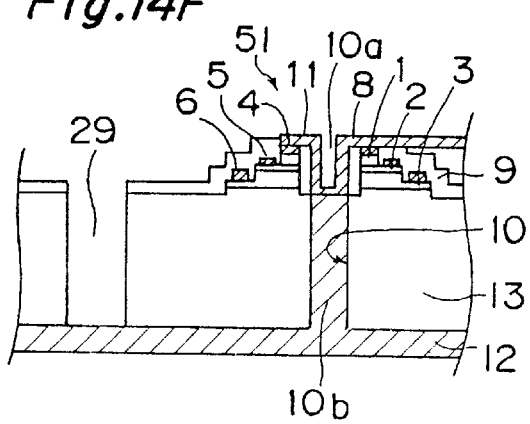

In this HBT 57, since the interior of the via hole 10 is buried with the same material as that of the provided on the rear surface side of the substrate 13. Next, as shown in FIG. 14D, by performing an RIE or other dry etching process with this mask 32, a second via hole 10b ranging from the rear surface side of the substrate 13 up to the bottom of the first via hole 10a is formed. In this case, the etching process is ended at a point at which the metal wiring line 11 at the bottom of the first via hole 10a appears. Next, as shown in FIG. 14E, by vapor deposition, sputtering, plating or other process, an about 10 μm thick PHS layer 12 made of gold is provided on the polished rear surface of the substrate so as to keep in contact with the metal wiring line 11 within the via hole 10 through the second via hole 10b. Finally, as shown in FIG. 14F, the resin 31 is dissolved by a solvent, by which the holding substrate 30 is removed from the top surface side of the substrate 13.

In such a case, a second via hole 10b to be formed from the rear surface side of the substrate can be easily aligned by a normal aligner with the first via hole 10a that has been formed from the top surface side of the substrate. Therefore, high-accuracy positional alignment can be achieved by normal photolithography techniques. Still, the polishing on the rear surface side of the substrate only needs to be done to a small extent of polishing. In addition, without polishing the rear surface side of the metal wiring line 11, a higher heat radiation effect through the via hole 10 can be obtained, so that the heat radiation property can be improved. As a result, stabler device characteristics as well as higher device reliability can be obtained.

Tenth Embodiment

Figure 17:
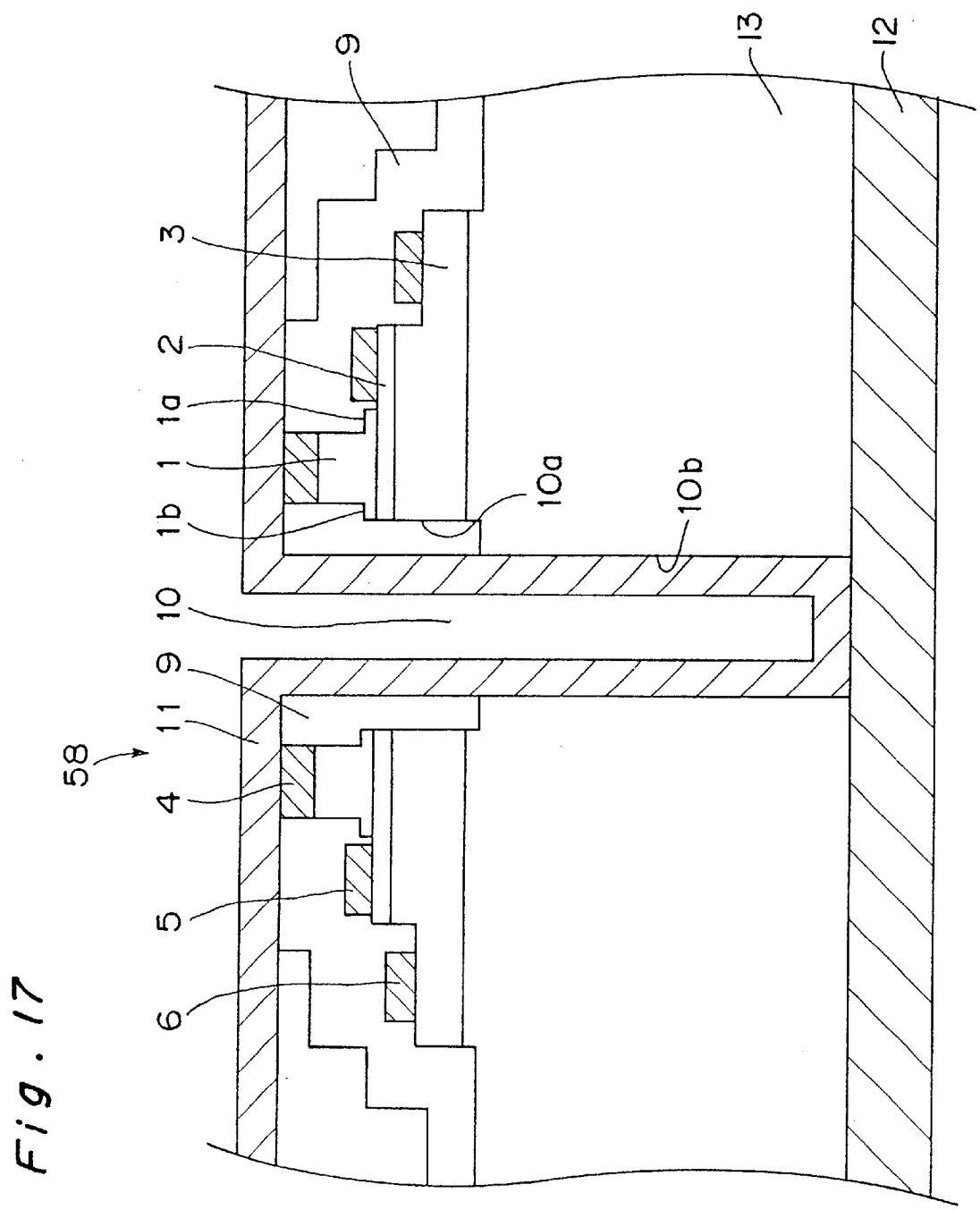
FIG. 17 is a sectional view showing an HBT according to a tenth embodiment of the invention.

FIG. 17 shows a cross section of an HBT 58 according to a tenth embodiment of the present invention. This HBT 58 differs from the HBT 51 shown in FIG. 4 only in that thickness of outer-edge portions 1a, 1b of the emitter layer 1 is set thinner than the thickness of the rest of the emitter layer 1, hence an edge-thinning structure.

For fabrication of this HBT 58, like the second embodiment, a first via hole 10a is formed. Subsequently, by performing photolithography process, on top of the rectangular-frame shaped emitter layer 1, a rectangular-frame shaped resist mask (not shown) having a width narrower than the width of the rectangular frame of the emitter layer 1 is provided. With this mask, the periphery of the emitter layer 1 is mesa-etched so that the thickness of outer-edge portions 1a, 1b of the emitter layer 1 becomes thinner than the thickness of the rest of the emitter layer 1 (edge-thinning structure). After this, like the second embodiment, a base ohmic electrode 5 is formed. The rest of processes are executed in the same manner as in the second embodiment.

In this HBT 58, the thickness of the outer-edge portions 1a, 1b of the emitter layer 1 is set thinner than the thickness of the rest of the emitter layer 1, that is, what we called an edge-thinning structure is formed. Therefore, the edge-thinning structure prevents recombination of holes and electrons generated between the peripheral edge portions 1a, 1b of the emitter layer 1 and the base layer 2 during operation. As a result, the device reliability can be enhanced.

Eleventh Embodiment

Figure 18:
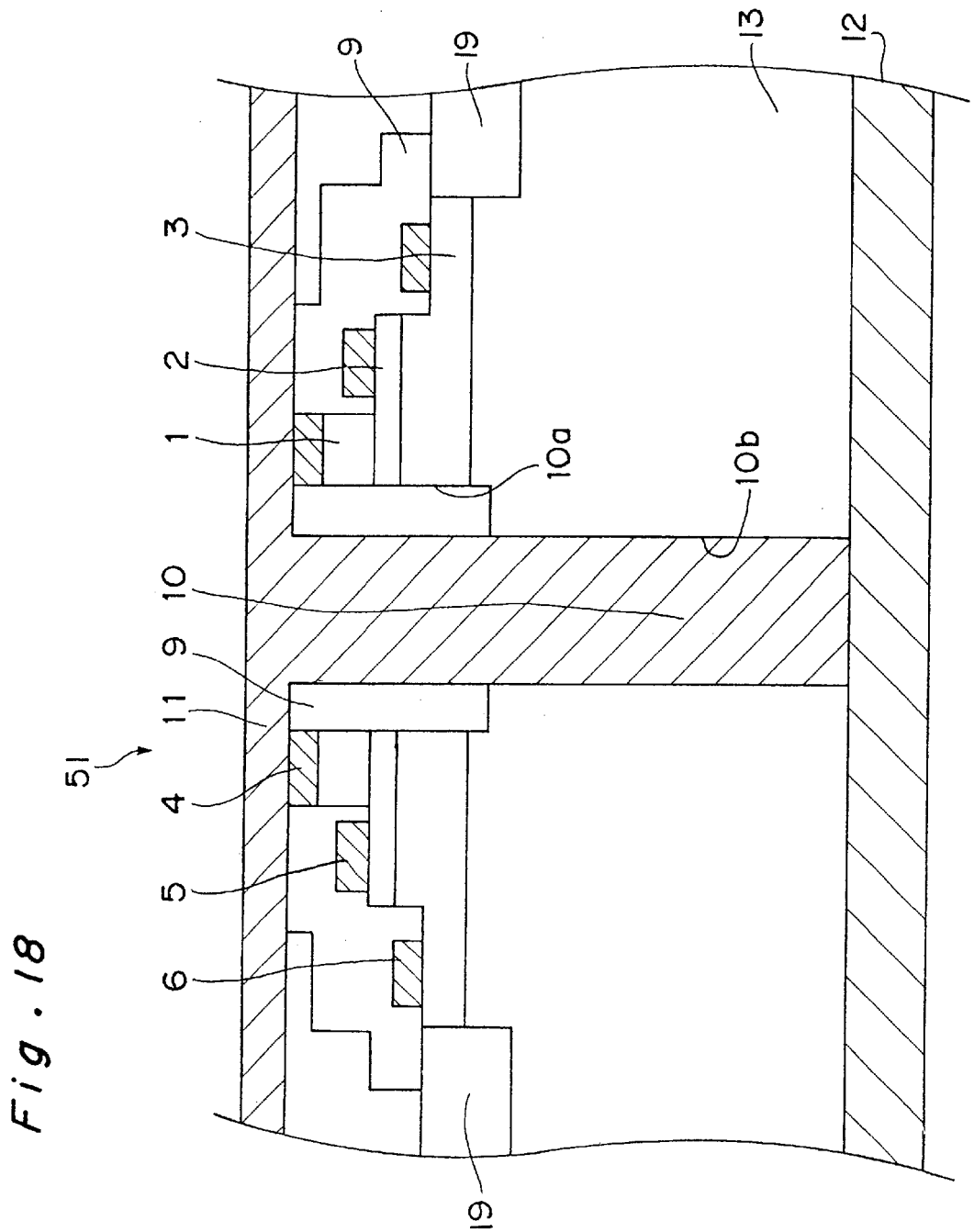
FIG. 18 is a sectional view showing an example in which a device isolation region is provided between adjacent HBTs.

FIG. 18 shows an example in which a device isolation region 19 is provided between adjacent HBTs 51. For simplicity, device isolation regions 19, 19 are shown on both sides of one HBT 51.

In this example, a plurality of sets of an emitter layer 1, a base layer 2 and a collector layer 3 are patterned in arrays on a common semiconductor substrate 13. After ohmic electrodes 4, 5, 6 are formed on the layers 1, 2, 3 and before the first via hole 10a is formed, oxygen ions, helium ions, hydrogen ions or the like are implanted at a high concentration of, for example, about $1 \times 10^{19}$ cm$^{-2}$ into the field region between adjacent collector layers 3. As a result, a high-resistivity (specific resistivity: approx. $1 \times 10^7$ Ω-cm) device isolation region 19 having a specified thickness is formed in the field region. The rest of processes are executed in the same manner as in the second embodiment.

In this case, during the photolithography process for forming the first via hole 10a, step gaps between the transistor portions (regions of the layers 1, 2, 3) and the field portions (regions between the transistors) on the substrate 13 are reduced by virtue of the thickness of the device isolation region 19. Thus, the photoresist mask is uniformized in film thickness. Therefore, during the process of etching the first via hole 10a, the possibility of occurrence of mask break can be eliminated. Still, a successful coverage property for the transistor portions can be obtained during the formation of the metal wiring line 11, so that the device reliability can be enhanced.

Twelfth Embodiment

Figure 19:
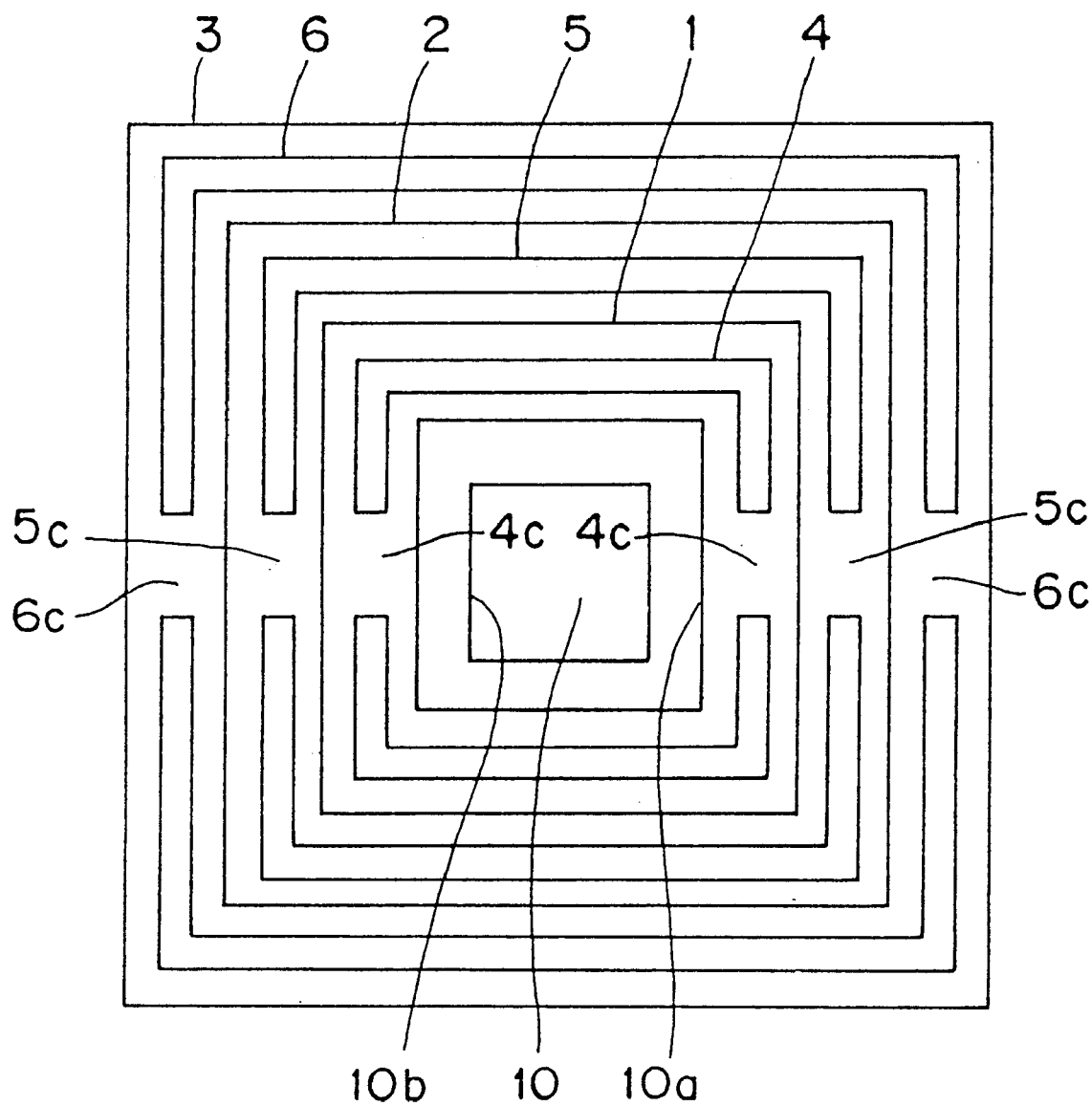
FIG. 19 shows a planar pattern of an emitter ohmic electrode 4, a base ohmic electrode 5 and a collector ohmic electrode 6 applicable to the above individual HBTs.

FIG. 19 shows a pattern of an emitter ohmic electrode 4, a base ohmic electrode 5 and a collector ohmic electrode 6 applicable to the above individual HBTs.

In this example, patterns of the emitter ohmic electrode 4, the base ohmic electrode 5 and the collector ohmic electrode 6 are those which surround a periphery of the region where the first via hole 10a is to be formed, with part of each pattern cut out. That is, the patterns of the ohmic electrodes 4, 5, 6, although being generally rectangular-frame shaped patterns, are not completely rectangular-frame shaped patterns but those in which central portions 4c, 5c, 6c on individual vertical sides of the patterns are cut out in the figure.

With the adoption of such patterns, the ohmic electrodes 4, 5, 6 are formed by the lift-off technology. When the lift-off resist is dissolved with a solution, the solution easily penetrates from outside to inside of the generally rectangular-frame shaped patterns through the cutout portions 4c, 5c, 6c. Thus, the lift-off process can be achieved more easily, as compared with the case where the patterns of the ohmic electrodes 4, 5, 6 are completely rectangular-frame shaped patterns.

In addition, when regular hexagonal or circular patterns are basically involved as in the HBTs 52, 53 (FIG. 7) of the fourth embodiment, the patterns of the ohmic electrodes 4, 5, 6 are set to those in which the regular hexagonal-frame shaped patterns or circular-frame shaped patterns are partly cut out. In brief, the lift-off process can be easily achieved only if the annular patterns are partly cut out.

Thirteenth Embodiment

Figure 20:
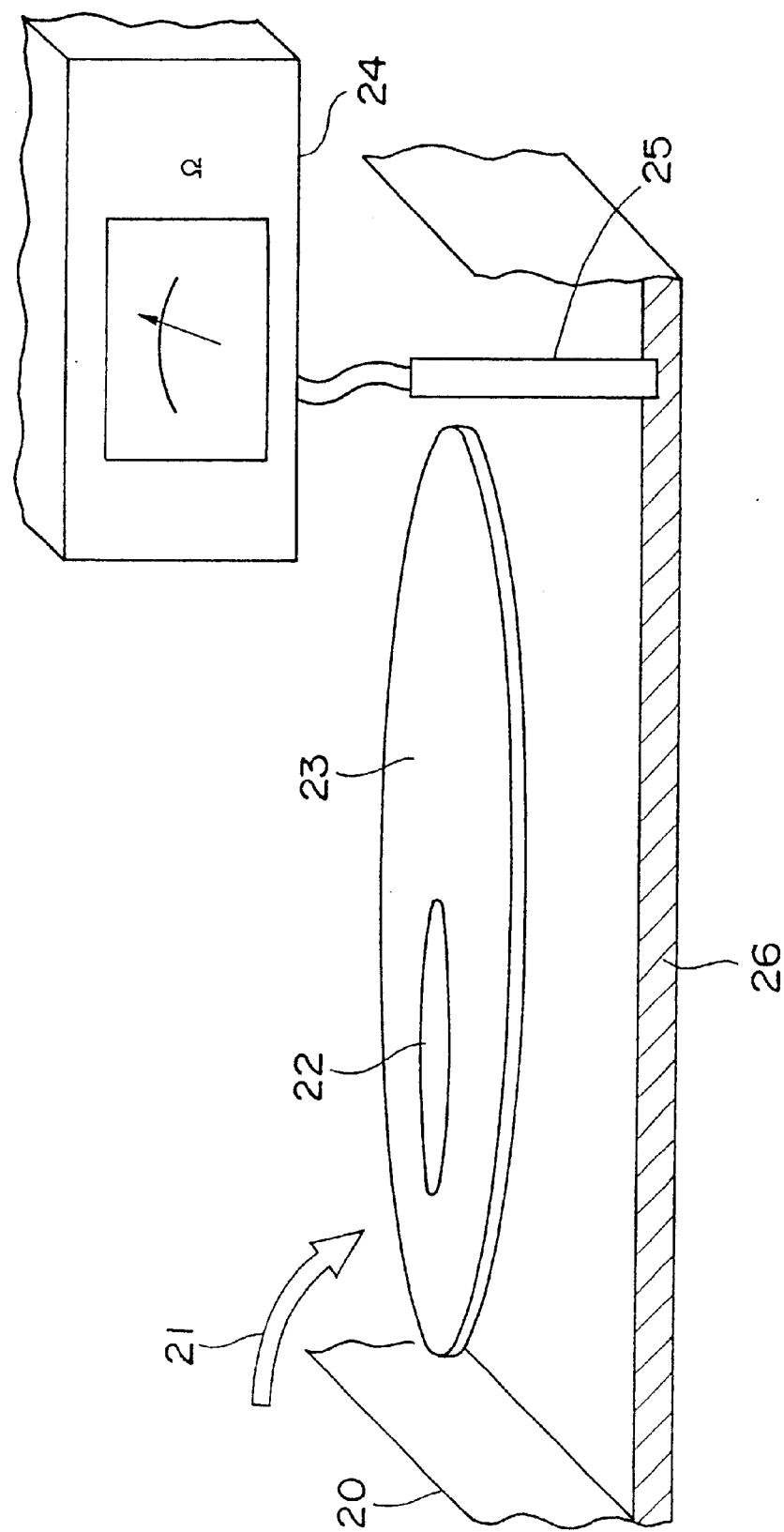
FIG. 20 shows a polishing apparatus applicable for polishing the rear surface side of a substrate in the above individual embodiments.

FIG. 20 shows a polishing apparatus 20 applicable for polishing the rear surface side of the substrate 13 in the above individual embodiments. This polishing apparatus 20 has, in its bath, a polishing table 23 on which a polishing target 22 (substrate 13 in this case) is to be placed. After the polishing table 23 is put into rotation, with a polishing liquid 21 thrown in, as the rear surface side of the substrate 13 is polished, the polishing liquid 21 is changed into a liquid waste 26, and the liquid waste 26 is stored in the bath. Electric resistance of this polishing liquid waste 26 is observed by a resistance meter 24 equipped with a resistance-forming sensor 25.

In the foregoing individual embodiments, when the rear surface side of the substrate 13 is polished up to the bottom of the first via hole 10a, electric resistance of the polishing liquid waste 26 is observed with the resistance meter 24 having the resistance-forming sensor 25. Then, the polishing process is ended at a time point at which the electric resistance of the polishing liquid waste 26 is changed by mingling cut chips of the metal wiring line 11 in the first via hole 10a with the liquid waste 26. With this arrangement, since the end point of polishing process is clarified, the accuracy of polishing extent on the rear surface side of the substrate is improved.

Fourteenth Embodiment

FIG. 21A shows a circuit diagram of a high-frequency two-stage amplifier 40 equipped with any of the HBTs indicated by reference numeral 34, 35 in the foregoing embodiments.

This high-frequency two-stage amplifier 40 has a first-stage amplification HBT 34 for amplifying a signal inputted to an input resistance 37 connected between an input terminal 33 and a ground 38, and a second-stage amplification HBT 35 for amplifying a signal outputted by the HBT 34. An output of the HBT 35 is delivered to an output terminal 36. Since the HBTs 34, 35 are superior in heat radiation property, this high-frequency two-stage amplifier 40 is enabled to perform high-power output operation with a high gain in high-frequency amplifications. Also, an enhanced reliability can be obtained. For example, this high-frequency two-stage amplifier 40 is mounted on a portable telephone 41 as a high-frequency transmitter or receiver, as shown in FIG. 21B. This portable telephone 41 is enabled to transmit microwaves with a high gain and with a large output power through an antenna 39.

In addition, the high-frequency amplifier is not limited to two-stage amplifiers, and a three-stage amplifier may be made up by providing three HBTs.

What is claimed is:

1. A heterojunction bipolar translator comprising:

an emitter layer, a base layer and a collector layer laminated on a top surface of a semiconductor substrate; and a heat sink layer made of a metal and provided on a rear surface of the substrate, wherein a via hole is cut through the emitter layer, the base layer, the collector layer and the substrate, and a surface electrode of the emitter layer and the heat sink layer are connected to each other by a metal wiring line running through within the via hole, wherein the metal wiring line does not form an air bridge between said surface electrode and said via hole.

2. The heterojunction bipolar transistor according to claim 1, wherein the via hole has a cross section formed into a polygonal shape in which apex angles are obtuse angles, or a circular shape.

3. The heterojunction bipolar transistor according to claim 1, wherein an interior of the via hole is buried with a same material as that of the metal wiring line.

4. The heterojunction bipolar transistor according to claim 1, wherein a peripheral edge portion of the emitter layer is formed so as to be thinner in thickness than residual portion of the emitter layer.

5. A parallel connection of heterojunction bipolar transistors, wherein a plurality of heterojunction bipolar transistors as defined in claim 1 are arrayed on a common semiconductor substrate and electrically connected to one another so as to be enabled to operate in parallel.

6. The parallel connection of heterojunction bipolar transistors according to claim 5, wherein a groove extending from the top surface of the substrate to the rear surface of the substrate is provided in the common semiconductor substrate so as to partition adjacent heterojunction bipolar transistors from one another.

7. A high-frequency transmitter or receiver including, as a high-frequency amplifier, the heterojunction bipolar transistor as defined in claim 1.

8. A high-frequency transmitter or receiver including, as a high-frequency amplifier, the parallel connected heterojunction bipolar transistors as defined in claim 5.

9. A high-frequency transmitter or receiver including, as a high-frequency amplifier, the heterojunction bipolar transistor made by the heterojunction bipolar transistor fabricating method as defined in claim 7.

10. A heterojunction bipolar transistor comprising:

a semiconductor substrate;

a heat sink layer provided on a rear surface of the semiconductor substrate and made of a metal;

a collector layer provided on a top surface of the semiconductor substrate;

a base layer provided on the collector layer;

an emitter layer provided on the base layer;

a metal wiring line running through within a via hole cut through the emitter layer, the base layer, the collector layer and the substrate; and an interlayer insulator provided between the metal wiring line and each of side walls of the emitter layer, the base layer and the collector layer, said side walls defining the via hole, wherein a surface electrode of the emitter layer and the heat sink layer are connected to each other by the metal wiring line, and wherein the metal wiring line does not form an air bridge between said surface electrode and said via hole.

* * * * *